(12) United States Patent
Hamasaki

(10) Patent No.: US 11,215,931 B2
(45) Date of Patent: Jan. 4, 2022

(54) SEMICONDUCTOR DEVICE MANUFACTURING SYSTEM, AND SEMICONDUCTOR DEVICE MANUFACTURING METHOD

(71) Applicant: Kioxia Corporation, Tokyo (JP)

(72) Inventor: Masakazu Hamasaki, Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/015,967

(22) Filed: Sep. 9, 2020

(65) Prior Publication Data

US 2021/0286271 A1    Sep. 16, 2021

(30) Foreign Application Priority Data

Mar. 13, 2020  (JP) .............................. JP2020-044628

(51) Int. Cl.
*G03F 7/20* (2006.01)
*H01L 21/027* (2006.01)

(52) U.S. Cl.
CPC ...... *G03F 7/70525* (2013.01); *H01L 21/0274* (2013.01)

(58) Field of Classification Search
CPC ............. G03F 7/70525; G03F 7/70666; G03F 7/70641; H01L 21/0274
USPC ............................................ 355/52, 55, 77
See application file for complete search history.

(56) References Cited

U.S. PATENT DOCUMENTS

| 5,654,553 | A | * | 8/1997 | Kawakubo | .......... | G03F 7/70066 |
|---|---|---|---|---|---|---|
| | | | | | | 250/548 |
| 6,798,497 | B2 | | 9/2004 | Butler | | |
| 2011/0053060 | A1 | * | 3/2011 | Tsubata | .............. | G03F 7/70666 |
| | | | | | | 430/30 |
| 2014/0125963 | A1 | * | 5/2014 | Watanabe | .......... | G03F 7/70483 |
| | | | | | | 355/77 |
| 2017/0336717 | A1 | * | 11/2017 | Shinoda | .............. | G03F 7/70641 |
| 2018/0292761 | A1 | | 10/2018 | Cekli et al. | | |

FOREIGN PATENT DOCUMENTS

| JP | 2004-71622 A | 3/2004 |
|---|---|---|
| JP | 2006-60043 A | 3/2006 |
| JP | 2009-231564 A | 10/2009 |
| WO | WO 2005/008752 A1 | 1/2005 |

* cited by examiner

*Primary Examiner* — Hung Nguyen
(74) *Attorney, Agent, or Firm* — Oblon, McClelland, Maier & Neustadt, L.L.P.

(57) ABSTRACT

According to one embodiment, there is provided a semiconductor device manufacturing system, including a storage unit, a specifying unit, a determination unit and an adjustment unit. The storage unit stores device information indicating a relationship between image formation performance of an exposure device used for manufacturing a semiconductor device and mechanical operation accuracy. The specifying unit specifies a constraint of the mechanical operation accuracy according to the device information and the required image formation performance. The determination unit determines whether or not a correction parameter of an exposure condition satisfies the constraint. The adjustment unit adjusts the correction parameter according to a determination result of the determination unit.

14 Claims, 19 Drawing Sheets

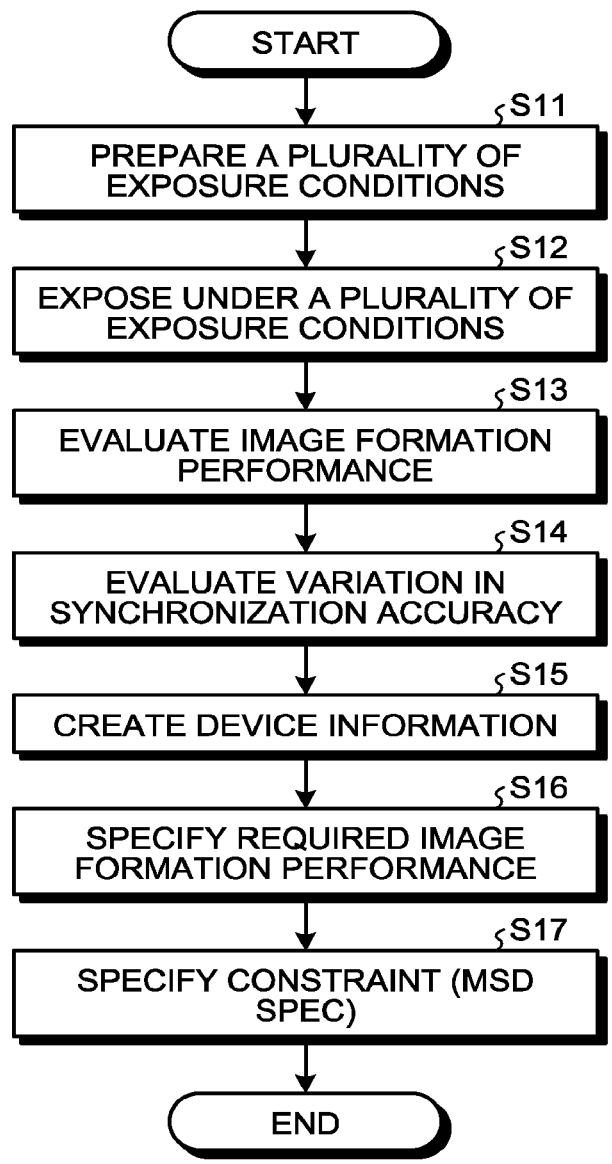

SEMICONDUCTOR DEVICE MANUFACTURING SYSTEM, AND SEMICONDUCTOR DEVICE MANUFACTURING METHOD

CROSS-REFERENCE TO RELATED APPLICATIONS

This application is based upon and claims the benefit of priority from Japanese Patent Application No. 2020-044628, filed on Mar. 13, 2020; the entire contents of which are incorporated herein by reference.

FIELD

Embodiments described herein relate generally to a semiconductor device manufacturing system and a semiconductor device manufacturing method.

BACKGROUND

An exposure device used for manufacturing a semiconductor device transfers a pattern of the semiconductor device onto a substrate by exposing the substrate according to an exposure condition and correction parameters thereof. At this time, it is desired to appropriately adjust the correction parameters.

BRIEF DESCRIPTION OF THE DRAWINGS

FIG. 5 is a flowchart illustrating a device information creation process in the embodiment;

DETAILED DESCRIPTION

Figure 1:
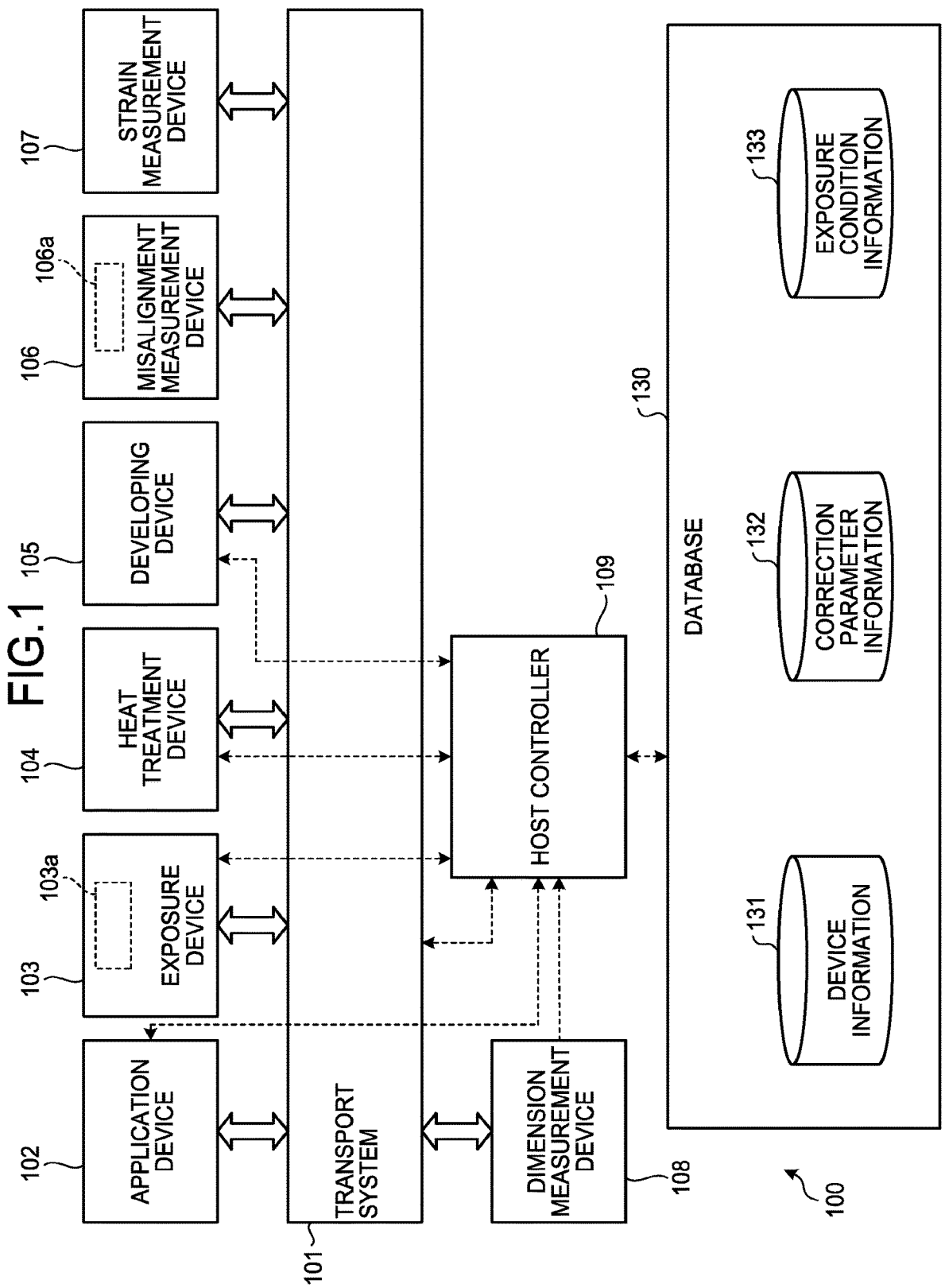
FIG. 1 is a diagram illustrating a configuration of a semiconductor device manufacturing system according to an embodiment.

In general, according to one embodiment, there is provided a semiconductor device manufacturing system, including a storage unit, a specifying unit, a determination unit and an adjustment unit. The storage unit stores device information indicating a relationship between image formation performance of an exposure device used for manufacturing a semiconductor device and mechanical operation accuracy. The specifying unit specifies a constraint of the mechanical operation accuracy according to the device information and the required image formation performance. The determination unit determines whether or not a correction parameter of an exposure condition satisfies the constraint. The adjustment unit adjusts the correction parameter according to a determination result of the determination unit.

Exemplary embodiments of a semiconductor device manufacturing system will be explained below in detail with reference to the accompanying drawings. The present invention is not limited to the following embodiments.

Embodiment

A semiconductor device manufacturing system according to an embodiment is used in a semiconductor device manufacturing process. In the semiconductor device manufacturing process, a plurality of layers are stacked above a substrate (for example, a semiconductor substrate). A device pattern and an overlay mark are formed on each layer for each shot region. A semiconductor circuit or the like is formed on the substrate by stacking the device patterns of the respective layers. In an exposure process of a semiconductor device, in order to determine a pattern transfer position to an upper layer before pattern formation, a reference position with respect to the transfer position is measured using the overlay mark of the lower layer. In a semiconductor device inspection process, in order to inspect whether upper and lower layers are appropriately superimposed after the pattern formation, a misalignment amount between the upper and lower layers is measured using the overlay marks of the upper and lower layers.

In the semiconductor device manufacturing process, in order to improve misalignment of exposure between each process, the misalignment correction is performed on the exposure device side. In recent years, it has become possible to correct the misalignment in a finer chip unit from a substrate/shot unit, but the influence on the exposure image formation performance cannot be ignored due to the correction of the fine range. As an example, the scan exposure is performed by synchronizing an original plate stage and a substrate stage, but if a scan speed is finely adjusted by chip magnification correction, a variation in synchronization accuracy may be deteriorated, which may affect the image formation performance. The variation in the synchronization accuracy is an index indicating the operation accuracy of the exposure operation performed by synchronizing the substrate stage and the original plate stage, and is also called moving standard deviation (MSD). When the correction in the fine range is performed, the requirement for correction followability with respect to the misalignment may become relatively strict with respect to the mechanical operation accuracy of the exposure device. At this time, the variation in the synchronization accuracy and the exposure image formation performance are in a trade-off relationship, and the image formation performance of patterning is affected when the variation in the synchronization accuracy is exacerbated. Therefore, it is desirable to understand the influence of the mechanical operation accuracy such as the variation in the synchronization accuracy on the image formation performance in advance and adjust the correction parameters.

Therefore, according to the present embodiment, in the semiconductor device manufacturing system, the relationship between the image formation performance and the mechanical operation accuracy is created in advance as the device information, the constraints of the operation accuracy are specified according to the device information and the required image formation performance, and the correction parameters can be optimized promptly by adjusting the correction parameters according to the constraints.

Specifically, the semiconductor device manufacturing system creates the device information indicating the relationship between the image formation performance of the exposure device and the mechanical operation accuracy, and stores the created device information in the database. The semiconductor device manufacturing system specifies the constraints of the mechanical operation accuracy according to the device information stored in the database and the required image formation performance. The semiconductor device manufacturing system can specify the operation accuracy corresponding to the required image formation performance in the device information as the constraints (for example, the upper limit of the variation in the synchronization accuracy) of the operation accuracy. The semiconductor device manufacturing system determines whether or not the correction parameters of the exposure condition satisfy the constraints of the operation accuracy. The semiconductor device manufacturing system adjusts the correction parameter according to the determination result. The semiconductor device manufacturing system performs adjustment to change the correction parameter so that the operation accuracy becomes better if the correction parameters of the exposure condition do not satisfy the constraints of the operation accuracy. The semiconductor device manufacturing system determines whether or not the adjusted correction parameters of the exposure condition satisfy the constraints of operation accuracy. The semiconductor device manufacturing system supplies the adjusted correction parameter to the exposure device if the adjusted correction parameters satisfy the constraints of the operation accuracy. As a result, the exposure device performs the exposure process by the exposure condition and the adjusted correction parameter. As a result, it is possible to promptly perform an appropriate adjustment of the correction parameter that satisfies the required image formation performance, and it is possible to promptly perform the exposure process and the process related thereto.

More specifically, the semiconductor device manufacturing system can be configured as illustrated in FIG. 1. FIG. 1 is a block diagram illustrating a hardware configuration of a semiconductor device manufacturing system 100.

The semiconductor device manufacturing system 100 includes a transport system 101, an application device 102, an exposure device 103, a heat treatment device 104, a developing device 105, a misalignment measurement device 106, a strain measurement device 107, a line width measurement device 108, a host controller 109, and a database 130. The application device 102, the exposure device 103, the heat treatment device 104, the developing device 105, the misalignment measurement device 106, the strain measurement device 107, and the line width measurement device 108 are configured to be able to transport a substrate to each other via the transport system 101.

The host controller 109 is communicably connected to the transport system 101, the application device 102, the exposure device 103, the heat treatment device 104, the developing device 105, the misalignment measurement device 106, the strain measurement device 107, the line width measurement device 108, and the database 130 via a communication line (not illustrated). The host controller 109 can refer to the database 130 while controlling the transport system 101, the application device 102, the exposure device 103, the heat treatment device 104, the developing device 105, the misalignment measurement device 106, the strain measurement device 107, and the line width measurement device 108, respectively.

Figure 2:
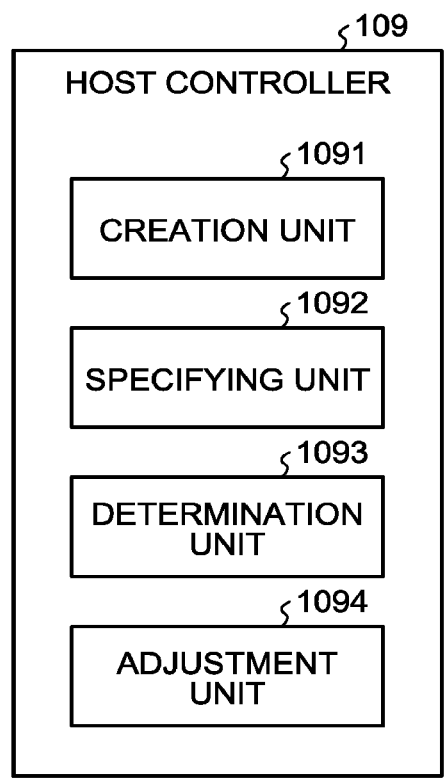
FIG. 2 is a diagram illustrating a functional configuration of a host controller according to the embodiment.

For example, the host controller 109 can be configured as illustrated in FIG. 2. FIG. 2 is a diagram illustrating a functional configuration of the host controller 109.

The host controller 109 has a creation unit 1091, a specifying unit 1092, a determination unit 1093, and an adjustment unit 1094.

The creation unit 1091 acquires information on the image formation performance of the exposure device 103 associated with a predetermined condition. The creation unit 1091 acquires information on the mechanical operation accuracy of the exposure device 103 associated with the predetermined condition. The creation unit 1091 plots the image formation performance and the operation accuracy for each predetermined condition on a coordinate plane by setting the image formation performance of the exposure device 103 on the vertical axis and the mechanical operation accuracy on the horizontal axis, thereby creating the relationship between the image formation performance of the exposure device 103 and the mechanical operation accuracy. When there are a plurality of types of semiconductor devices, the creation unit 1091 creates the device information for each type. The plurality of types of semiconductor devices differ from each other in a layout of a chip region in the shot region. The creation unit 1091 stores the created device information 131 in the database 130 in association with a type identifier. As a result, the device information 131 associated with each type identifier can be stored in the database 130 by the number of types (see FIG. 1).

In addition, the creation unit 1091 also acquires the required exposure condition. When there are the plurality of types of semiconductor devices, the creation unit 1091 acquires the required exposure condition in association with the type identifier. The creation unit 1091 may receive the exposure condition information and the type identifier via an input interface such as a keyboard, thereby acquiring the required exposure condition information in association with the type identifier. The specifying unit 1092 may receive the exposure condition information and the type identifier from the outside through a network via a communication interface to obtain the required exposure condition information in association with the type identifier. The creation unit 1091 stores exposure condition information 133 in the database 130 in association with the type identifier. As a result, the exposure condition information 133 associated with each type identifier can be stored in the database 130 by the number of types (see FIG. 1).

In addition, the creation unit 1091 acquires the correction parameter of the exposure device 103. The correction parameter is a parameter for performing a predetermined correction on the exposure condition, and includes, for example, a correction amount profile of the misalignment correction. When there are the plurality of types of semiconductor devices, the creation unit 1091 creates the correction parameter (for example, the correction amount profile of the misalignment correction) information for each type. The creation unit 1091 stores the created correction parameter information 132 in the database 130 in association with the type identifier. As a result, the correction parameter information 132 associated with each type identifier can be stored in the database 130 by the number of types (see FIG. 1).

The specifying unit 1092 refers to the database 130 and acquires the exposure condition information 133 corresponding to the type to be processed. The specifying unit 1092 specifies the image formation performance required for the type to be processed based on the exposure condition information 133. When the requested image formation performance is specified, the specifying unit 1092 refers to the database 130 and acquires the device information 131 corresponding to the type to be processed. The specifying unit 1092 specifies the constraints of the mechanical operation accuracy according to the acquired device information 131 and the required image formation performance. The specifying unit 1092 specifies the operation accuracy corresponding to the required image formation performance in the device information 131 as the constraints (for example, the upper limit of the variation in the operation accuracy) of the operation accuracy. The specifying unit 1092 supplies the specified constraints of the operation accuracy to the determination unit 1093.

The determination unit 1093 refers to the database 130 and acquires the correction parameter information 132 corresponding to the type to be processed. The determination unit 1093 receives the constraints of the operation accuracy from the specifying unit 1092. The determination unit 1093 determines, based on the correction parameter information 132, whether or not the correction parameters of the exposure condition satisfy the constraints of the operation accuracy. For example, when the constraints of the operation accuracy are the upper limit of the variation in the operation accuracy and the shot region includes the plurality of chip regions, the determination unit 1093 acquires the correction parameters for each of the plurality of chip regions, and determines that the correction parameters satisfy the constraints when a worst value of the variation in the operation accuracy in each correction parameter exceeds the upper limit of the variation in the operation accuracy. The determination unit 1093 determines that the correction parameters satisfies the constraints when the worst value of the variation in the operation accuracy in each correction parameter is equal to or less than the upper limit of the variation in the operation accuracy. The determination unit 1093 supplies the determination result to the adjustment unit 1094.

The adjustment unit 1094 adjusts the correction parameter according to the determination result of the determination unit 1093. If the correction parameters of the exposure condition do not satisfy the constraints of the operation accuracy, the adjustment unit 1094 adjusts the correction parameter so that the constraints of the operation accuracy are satisfied (for example, so that the synchronization accuracy becomes better). For example, when the constraints of the operation accuracy are the upper limit of the variation in the synchronization accuracy, the adjustment unit 1094 adjusts the correction parameter so that the variation in the synchronization accuracy becomes smaller. The adjustment unit 1094 supplies the adjusted correction parameter to the determination unit 1093. The determination unit 1093 determines whether or not the adjusted correction parameters satisfy the constraints of the operation accuracy. The determination unit 1093 supplies the determination result to the adjustment unit 1094.

If the adjusted correction parameters do not satisfy the constraints of the operation accuracy, the adjustment unit 1094 again performs the adjustment to change the correction parameters so that the constraints of the operation accuracy are satisfied. For example, when the constraints of the operation accuracy are the upper limit of the variation in the synchronization accuracy, the adjustment unit 1094 adjusts the correction parameter so that the variation in the synchronization accuracy becomes smaller. The adjustment unit 1094 supplies the adjusted correction parameter to the determination unit 1093. The determination unit 1093 again determines whether or not the adjusted correction parameters satisfy the constraints of the operation accuracy. The determination unit 1093 supplies the determination result to the adjustment unit 1094.

The adjustment unit 1094 supplies the adjusted correction parameter to the exposure device 103 and the misalignment measurement device 106 if the adjusted correction parameters satisfy the constraints of the operation accuracy. As a result, the exposure device 103 and the misalignment measurement device 106 can perform the exposure process and the process related thereto with the exposure condition and the adjusted correction parameter.

Figure 3:
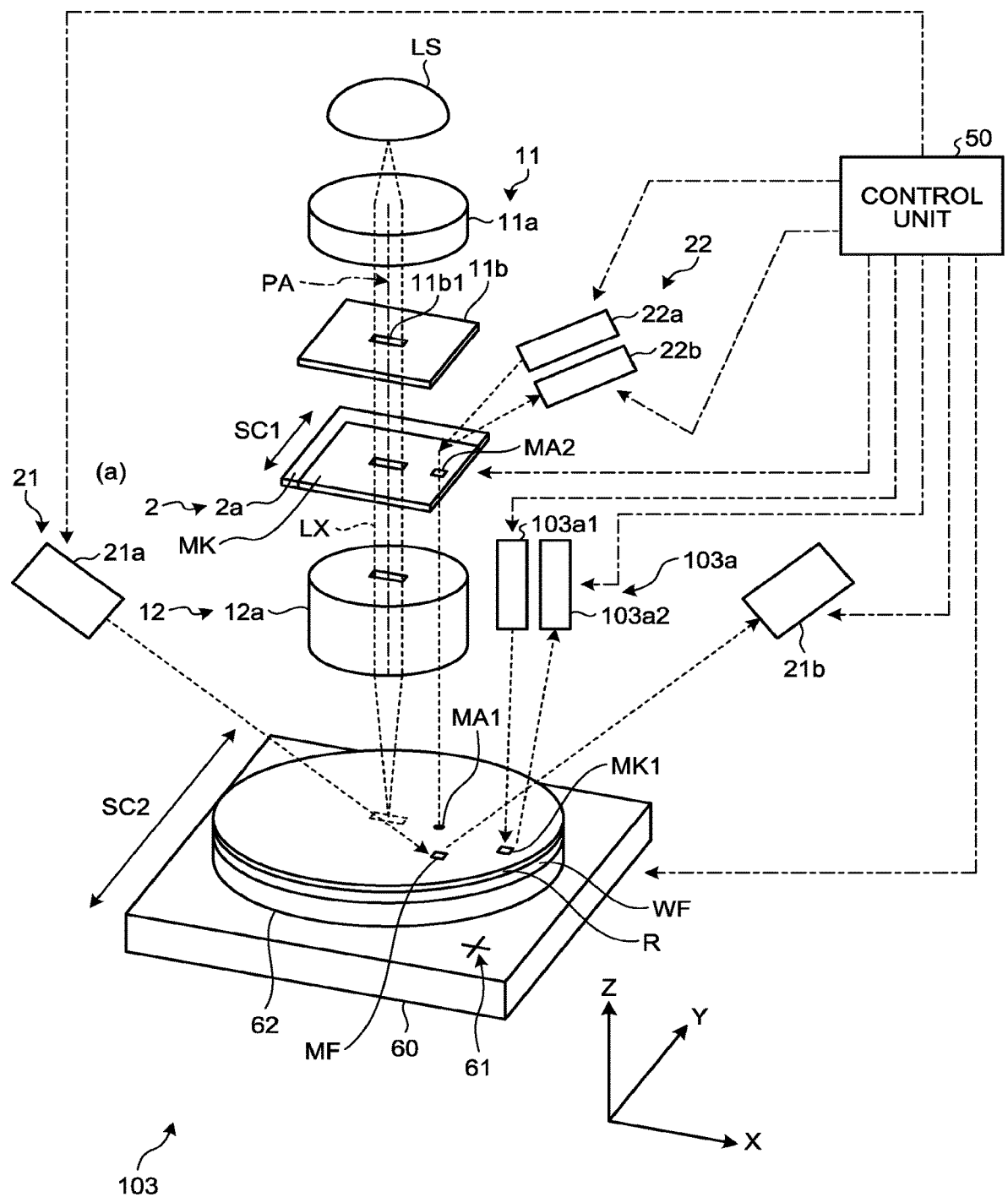
FIG. 3 is a diagram illustrating a configuration of an exposure device according to the embodiment.

Next, the configuration of the exposure device 103 will be described with reference to FIG. 3. FIG. 3 is a perspective view illustrating the configuration of the exposure device 103.

The exposure device 103 is, for example, a scanning type exposure device (scanner). The scanning type exposure device is a device for projecting and exposing a pattern drawn on an original plate MK onto a substrate WF to be exposed while moving the original plate stage 2 and the substrate stage 60 in synchronization with each other in scanning directions SC1 and SC2. In the following, the direction away from the substrate WF on the optical axis PA of the projection optical system 12 is defined as a +Z direction. A synchronous movement direction (scanning direction) between the original plate MK and the substrate WF in a plane perpendicular to the Z direction is defined as a Y direction. The direction (non-scanning direction) perpendicular to the Z and Y directions is defined as the X direction. The directions around the X axis, the Y axis, and the Z axis are defined as a θX direction, a θY direction, and a θZ direction, respectively.

The exposure device 103 has the optical system 10, the original plate stage 2, and the position control system 20. The optical system 10 has an illumination optical system 11 and a projection optical system 12. The position control system 20 includes a focus detection system 21, an alignment detection system 22, a measurement device 103a, a control unit 50, and a substrate stage 60. The original plate stage 2 is also called a mask stage, and the substrate stage 60 is also called a wafer stage.

The illumination optical system 11, the original plate stage 2, and the projection optical system 12 are arranged around the optical axis PA. The optical axis PA is an axis indicating a direction in which a chief ray of the exposed light travels from the light source LS to the substrate WF.

The substrate stage 60 has a chuck mechanism 62 (for example, a vacuum chuck or an electrostatic chuck), and holds the substrate WF using the chuck mechanism 62. A photosensitive material (resist) R is applied on the substrate WF. An alignment mark MA1, for example, is formed on the substrate WF before the photosensitive material R is applied.

The substrate stage 60 moves in the X direction, the Y direction, and the Z direction or rotates in the θX direction, the θY direction, and the θZ direction while holding the substrate WF. As a result, the substrate stage 60 positions the substrate WF. Further, the substrate stage 60 has a reference mark 61 formed on an upper surface thereof.

In the +Z direction of the substrate stage 60, the original plate stage 2 is arranged with the projection optical system 12 therebetween. The original plate stage 2 has a chuck mechanism 2a (for example, a vacuum chuck or an electrostatic chuck), and holds the original plate MK using the chuck mechanism 2a. In addition to the pattern of the circuit to be transferred, for example, a pattern of an alignment mark MA2 is drawn on the original plate MK.

The projection optical system 12 projects and exposes light incident on the original plate MK onto the substrate WF to form an image on the substrate WF according to the pattern drawn on the original plate MK. The projection optical system 12 can change a magnification of an image projected on the substrate WF.

The illumination optical system 11 is arranged in the +Z direction of the original plate stage 2. The illumination optical system 11 has an illumination lens 11a and a slit plate 11b. The illumination lens 11a illuminates an illumination region of the original plate MK with exposed light LX having a uniform illuminance distribution. The slit plate 11b is provided with a slit 11b1, and shapes the exposed light LX passed from the illumination lens 11a in a slit shape by the slit 11b1. The exposed light LX is diffracted by the pattern drawn on the original plate MK and is incident on the projection optical system 12.

The focus detection system 21 performs focus measurement for detecting the position (height position) of the substrate WF in the Z direction.

The focus detection system 21 has a projection system 21a and a light receiving system 22b. The projection system 21a and the light receiving system 22b are located diagonally above a measurement target (for example, the substrate WF) at positions facing each other. The light irradiated from the projection system 21a travels along the optical axis through a predetermined optical system, and is formed as an image (measurement mark MF) having a predetermined shape on the substrate WF and is reflected. The reflected light travels along the optical axis through a predetermined optical system, is again formed as an image having a predetermined shape by the light receiving system 22b and received, and a signal corresponding to the received image IM is supplied to the control unit 50. As a result, the focus detection system 30 performs the focus measurement for detecting the position (height position) of the substrate WF in the Z direction.

An alignment detection system 22 performs alignment measurement for detecting the position (plane direction position) of the substrate WF in the X and Y directions. The alignment detection system 22 can detect the position of the substrate WF in the X and Y directions with respect to the exposure device 103 based on the reference mark 61 on the substrate stage 60.

The alignment detection system 22 has a projection system 22a and a light receiving system 22b. The projection system 22a generates measured light such as laser light (visible light or infrared light) and irradiates the generated measured light to the alignment marks MA1 and MA2 via a predetermined reflection system. The measured light reflected by the alignment marks MA1 and MA2 is received by the light receiving system 22b via a predetermined reflection system, and a signal corresponding to the received image is supplied to the control unit 50. As a result, the alignment detection system 22 performs the focus measurement for detecting the position (plane direction position) of the substrate WF in the XY direction.

The measurement device 103a performs measurement for determining the pattern transfer position to the upper layer before the pattern formation.

The measurement device 103a has a projection system 103a1 and a light receiving system 103a2. The projection system 103a1 generates the measured light such as laser light (visible light or infrared light) and irradiates the generated measured light to an overlay mark MK1 via a predetermined reflection system. The measured light reflected by the overlay mark MK1 is received by the light receiving system 103a2 via a predetermined reflection system, and a signal corresponding to the received image is supplied to the control unit 50. Note that in FIG. 3, for convenience of illustration, the alignment mark MA1 and the overlay mark MK1 are illustrated at positions separated from each other on the substrate WF, but the alignment mark MA1 and the overlay mark MK1 can be arranged in a kerf region KR of a chip region CH of the measurement target (see FIG. 6A). Alternatively, the measurement device 103a may perform measurement with a small measurement mark arranged in a device region DR of the chip region CH, a main body pattern arranged in the device region DR, or the like, instead of the overlay mark MK1 arranged in the kerf region KR. That is, the measurement device 103a may use the projection system 103a1 to irradiate the measured light to the small measurement mark in the device region DR, the main body pattern in the device region DR, or the like, and receive the reflected light by the light receiving system 103a2.

At this time, the exposure device 103 can use the measurement device 103a to perform the measurement while performing the correction with the adjusted correction parameter, so the reference position for determining the pattern transfer position can be accurately measured. As a result, the exposure device 103 can accurately determine the pattern transfer position and can perform the exposure process with high accuracy. As a result, it is possible to promptly perform the appropriate adjustment of the correction parameter that satisfies the required image formation performance, and it is possible to promptly perform the exposure process and the process related thereto.

Figure 4:
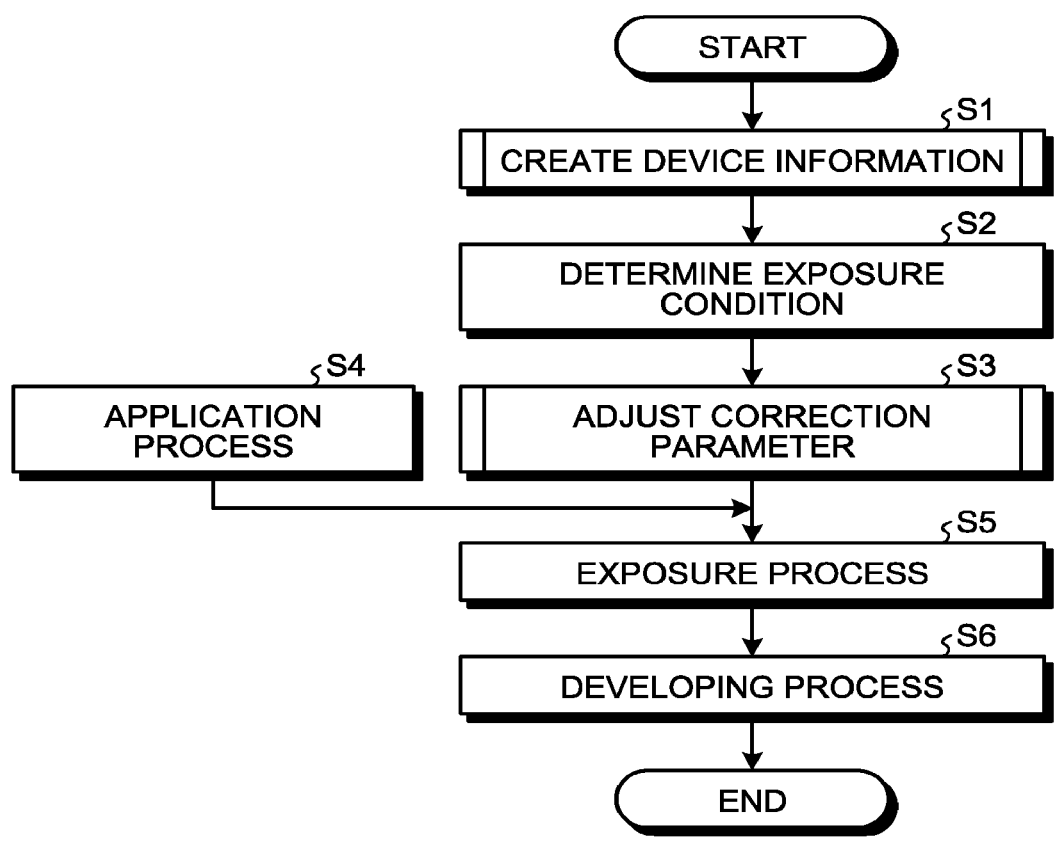
FIG. 4 is a flowchart illustrating an operation of the semiconductor device manufacturing system according to the embodiment.

Next, the operation of the semiconductor device manufacturing system 100 will be described with reference to FIG. 4. FIG. 4 is a flowchart illustrating an operation of the semiconductor device manufacturing system 100.

The semiconductor device manufacturing system 100 performs a device information creation process (S1) of creating the device information indicating the relationship between the image formation performance of the exposure device 103 and the mechanical operation accuracy. The semiconductor device manufacturing system 100 performs alignment measurement, measurement for determining the pattern transfer position, and the like, and determines the exposure condition according to the measurement result (S2). The semiconductor device manufacturing system 100 performs the correction parameter adjustment process (S3) for adjusting the correction parameter for correcting the exposure condition. The semiconductor device manufacturing system 100 uses the application device 102 to perform an application process (S4) of applying the substrate to be processed with a photosensitive agent in parallel with S1 to S3. The semiconductor device manufacturing system 100 uses the transport system 101 to transport the substrate applied with the photosensitive agent in S4 from the application device 102 to the exposure device 103. The semiconductor device manufacturing system 100 uses the exposure device 103 to perform an exposure process (S5) of forming a latent image on the substrate according to the exposure condition determined in S2 and the correction parameter adjusted in S3. The semiconductor device manufacturing system 100 uses the transport system 101 to transport the substrate exposed in S5 from the exposure device 103 to the developing device 105. The semiconductor device manufacturing system 100 uses the developing device 105 to perform a development process (S6) of developing the latent image formed on the substrate. Note that the semiconductor device manufacturing system 100 may perform heat treatment on the substrate with the heat treatment device 104 before and/or after S6.

Next, details of the device information creation process (S1) will be described with reference to FIG. 5. FIG. 5 is a flowchart illustrating the device information creation process.

The semiconductor device manufacturing system 100 prepares a plurality of exposure conditions for varying the misalignment correction amount (S11). In the plurality of exposure conditions, the combinations of the exposure amount of the illumination optical system 11 onto the substrate and the focus value of the projection optical system 12 that defines the image forming plane of the substrate are different.

The semiconductor device manufacturing system 100 controls the exposure device 103 according to each exposure condition to create a focus exposure matrix (FEM) substrate (S12).

At this time, the exposure device 105 controls the illumination optical system 11 and the projection optical system 12 to make the combinations of the exposure amount of the illumination optical system 11 onto the substrate and the image plane of the substrate formed by the projection optical system 12 for each shot region different from each other. The FEM substrate has a plurality of shot regions arranged in a matrix (XY direction), shot regions having different exposure amounts arranged in the X direction, and shot regions having different focus values arranged in the Y direction.

Figure 6A:
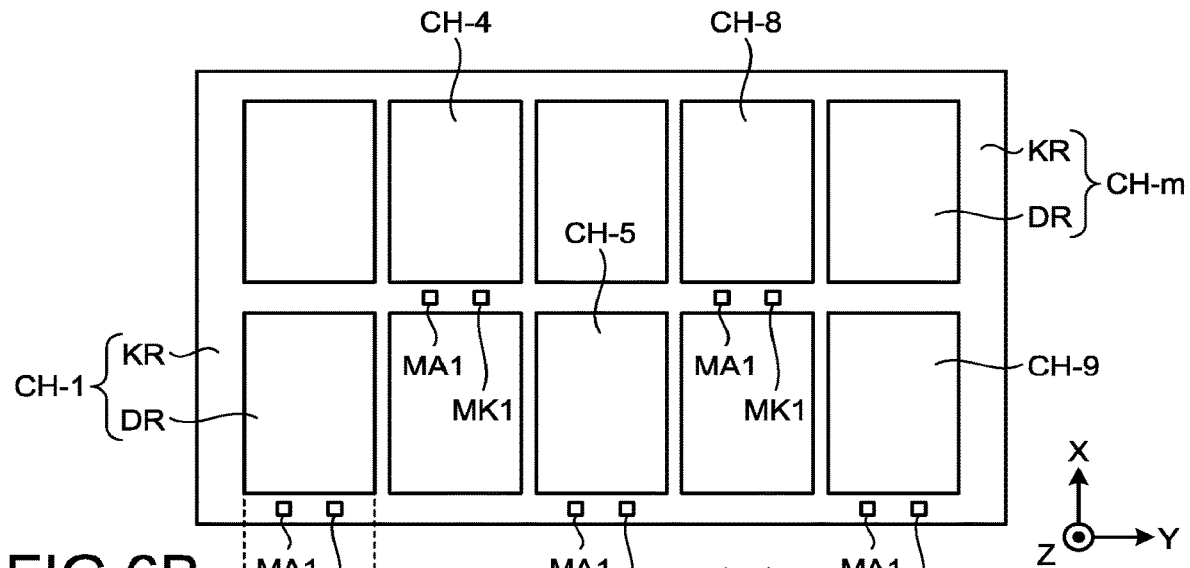
FIGS. 6A and 6B are diagrams illustrating a relationship between a shot region and a misalignment correction amount in the embodiment.
Figure 6B:
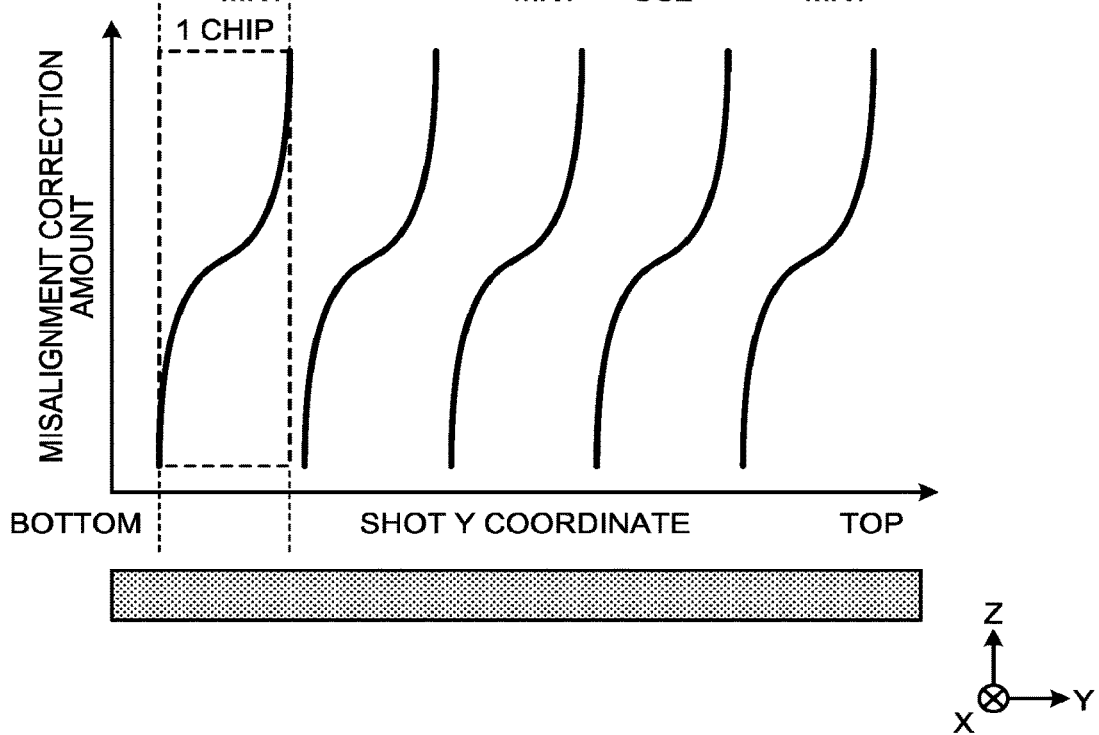

As illustrated in FIG. 6A, each shot region has a plurality of chip regions CH-1 to CH-m (m is an arbitrary integer of 2 or more). Each chip region CH includes the device area DR and the kerf region KR. The kerf region KR is a region (peripheral region) arranged around the device region DR. Among a plurality of chip regions CH-1 to CH-m, the plurality of chip regions CH-1, CH-4, CH-5, CH-8, and CH-9 of the measurement target are arranged to be shifted from each other in the scanning direction SC2 (Y direction) in the shot region SH. The alignment mark MA1 and the overlay mark MK1 are arranged in the kerf region KR in each chip region CH-1, CH-4, CH-5, CH-8, and CH-9 of the measurement target. The misalignment correction amount is set in each chip region CH-1, CH-4, CH-5, CH-8, and CH-9 of the measurement target as illustrated in FIG. 6B.

That is, the exposure device 105 controls the illumination optical system 11 and the projection optical system 12 to perform the exposure of the substrate while correcting the exposure condition according to the set misalignment correction amount for each chip region within each shot region.

The semiconductor device manufacturing system 100 evaluates the image formation performance by measuring the FEM substrate with the dimension measurement device 108 (S13). The dimension measurement device 108 is, for example, a critical dimension scanning electron microscopy (CDSEM), and can obtain a CD measurement value as a measurement result for each shot region corresponding to the exposure condition.

Figure 7A:
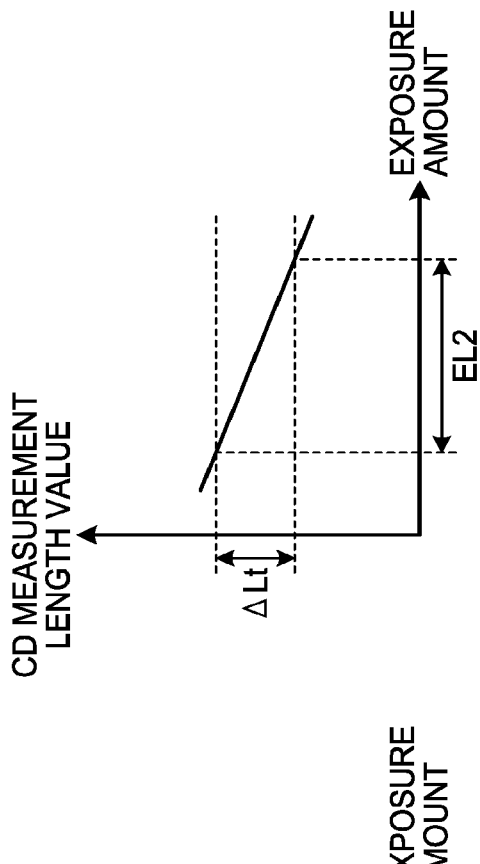
FIGS. 7A to 7D are diagrams illustrating an evaluation of an exposure amount margin and a focus depth in the embodiment.

For example, the measurement result of the dimension measurement device 108 is the result illustrated in FIG. 7A for the chip region CH-1 within the plurality of shot regions corresponding to the plurality of exposure conditions in which the exposure amounts are different and the focus value is common. From the results illustrated in FIG. 7A, a range EL1 of the exposure amount corresponding to an allowable dimension ΔLt is an exposure amount margin of the chip region CH-1.

Figure 7B:
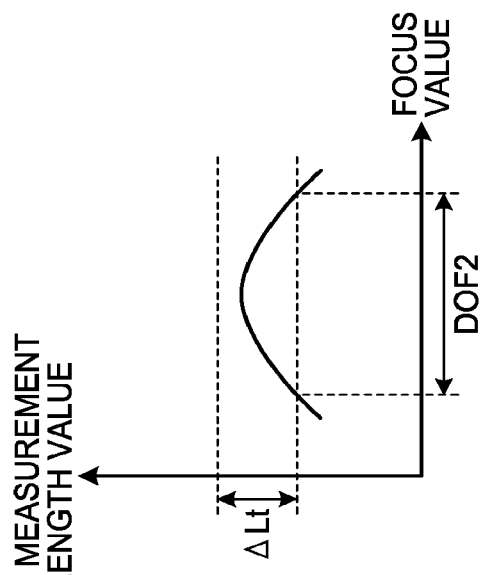

For example, the measurement result of the dimension measurement device 108 is the result illustrated in FIG. 7B for the chip region CH-1 within the plurality of shot regions corresponding to the plurality of exposure conditions in which the exposure amount is common and the focus values are different from each other. From the results illustrated in FIG. 7B, a range DOF1 of the focus value corresponding to the allowable dimension ΔLt is a focus depth of the chip region CH-1.

Figure 7C:
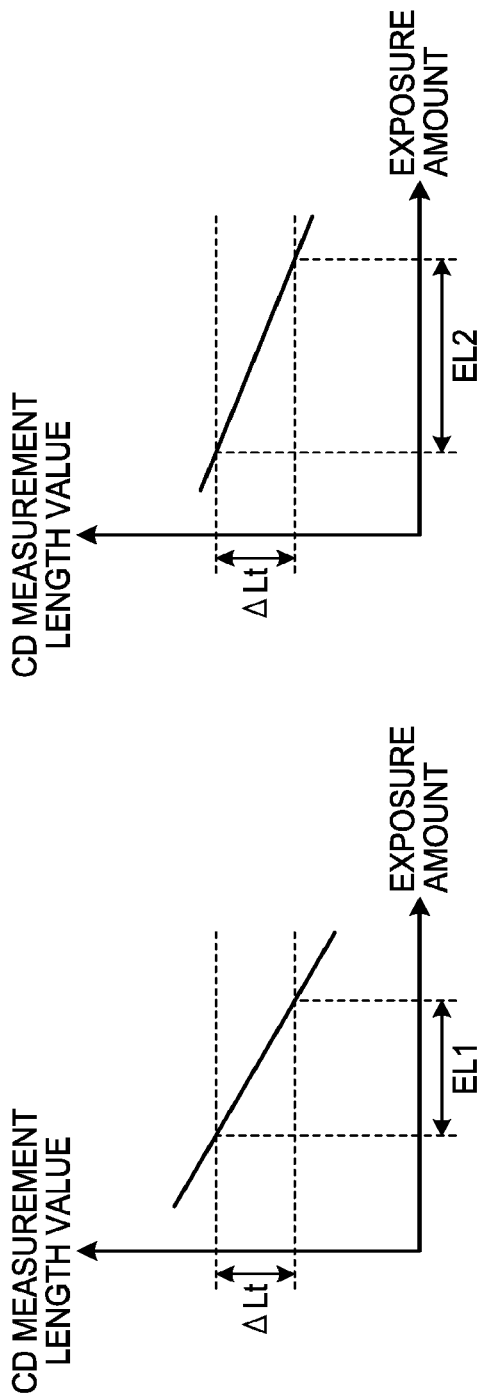

Alternatively, the measurement result of the dimension measurement device 108 is the result illustrated in FIG. 7C for the chip region CH-9 within the plurality of shot regions corresponding to the plurality of exposure conditions in which the exposure amounts are different and the focus values are common. From the results illustrated in FIG. 7C, a range EL2 of the exposure amount corresponding to the allowable dimension ΔLt is an exposure amount margin of the chip region CH-9.

Figure 7D:
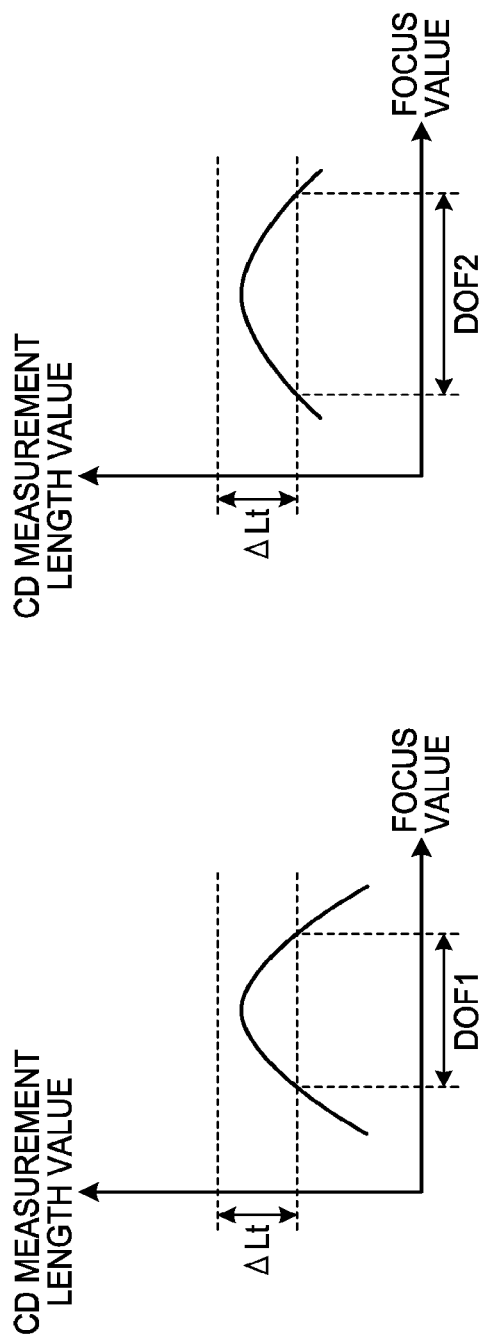

The measurement result of the dimension measurement device 108 is the result illustrated in FIG. 7D for the chip region CH-9 within the plurality of shot regions corresponding to the plurality of exposure conditions in which the exposure amount is common and the focus values are different from each other. From the results illustrated in FIG. 7D, a range DOF2 of the focus value corresponding to the allowable dimension ΔLt is a focus depth of the chip region CH-9.

The semiconductor device manufacturing system 100 requests the image formation performance for each chip region in the shot region. For example, as illustrated in FIG. 8, the semiconductor device manufacturing system 100 plots the evaluation results on a scatter diagram by setting the exposure amount on the horizontal axis and the focus value on the vertical axis, and obtains the size of the exposure margin (EM) including the exposure amount margin and the focus depth as a value of the image formation performance.

Figure 8:
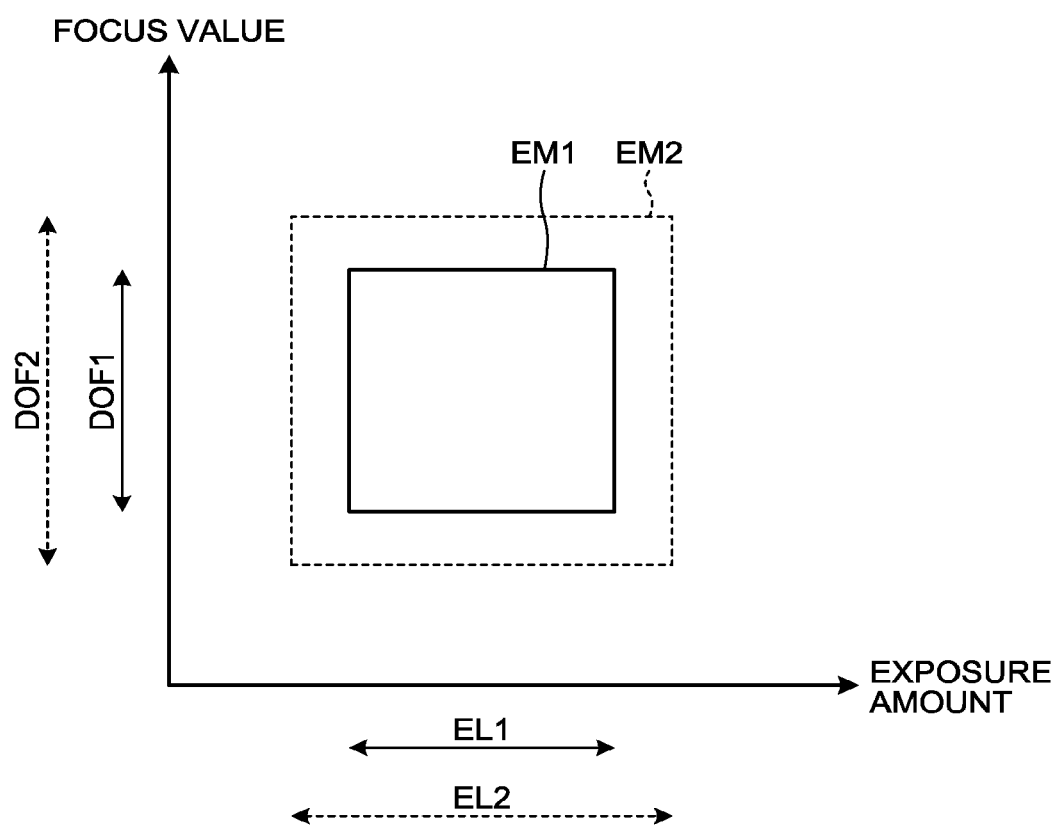
FIG. 8 is a diagram illustrating an evaluation of image formation performance in the embodiment.

For example, for the chip region CH-1 in the shot region, the exposure margin EM1 including the exposure amount margin EL1 and the focus depth DOF1 is plotted on the scatter diagram as illustrated by the solid line in FIG. 8. An area of the exposure margin EM1 on the scatter diagram is obtained, and a size of the area is taken as the value of the image formation performance.

For the chip region CH-9 in the shot region, the exposure margin EM2 including an exposure amount margin EL2 and a focus depth DOF2 is plotted on the scatter diagram as illustrated by the dotted line in FIG. 8. An area of the exposure margin EM2 on the scatter diagram is obtained, and a size of the area is taken as the value of the image formation performance.

The semiconductor device manufacturing system 100 evaluates the variation in the synchronization accuracy by measuring the FEM substrate with the measurement device 103a (S14). The semiconductor device manufacturing system 100 obtains the variation in the synchronization accuracy for each chip region in the shot region.

Figure 9A:
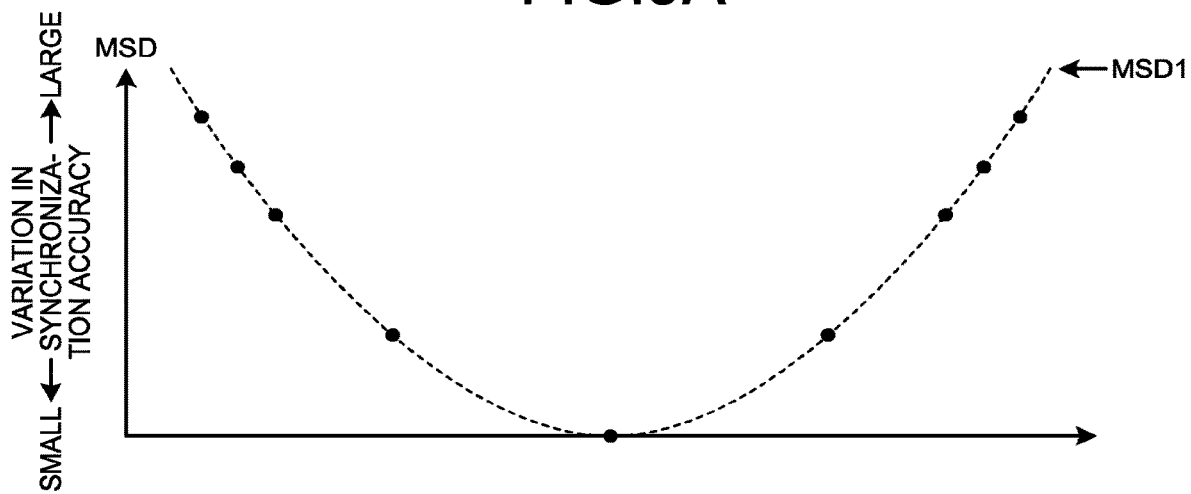
FIGS. 9A to 9C are diagrams illustrating evaluation results of variations in synchronization accuracy of the exposure device according to the embodiment.
Figure 9B:
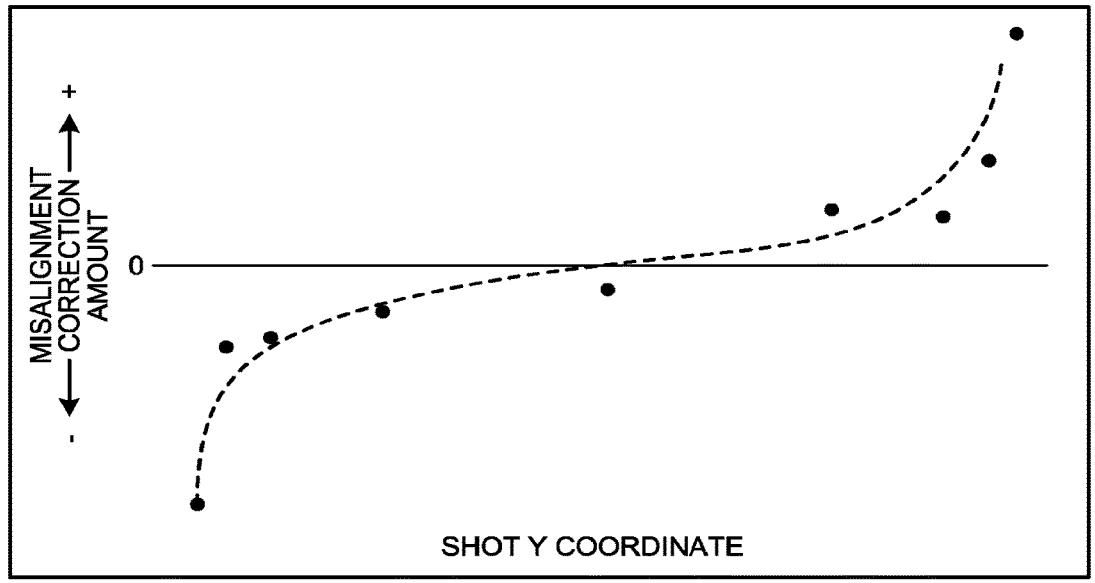
Figure 9C:
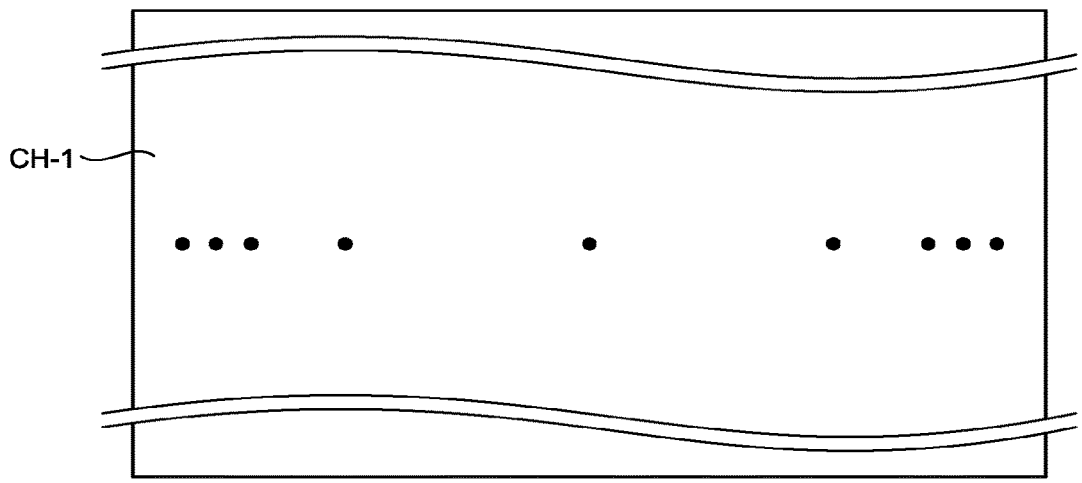

For example, for the chip region CH-1 in the shot region, when the original plate stage 2 and the substrate stage 60 are synchronously scanned according to the misalignment correction amount illustrated in FIG. 9B, the variation in the synchronization accuracy at each point illustrated in FIG. 9C is evaluated. When i, j, and n each are arbitrary positive integers, a Y coordinate of a (j+n−1)-th point among a plurality of points measured by the measurement device 103a is set to be $\delta y_{j+n-1}$, and an average value pi of the Y coordinates of i-th to (i+n−1)-th points is represented by the following Equation 1. An average value pi of the Y coordinates is set to be a reference position for the variation in the synchronization accuracy.

$$\mu_i = \frac{1}{n} \sum_{j=i-(n-1)}^{i} \delta y_{j+n-1} \tag{1}$$

At this time, a value $\sigma_i^2$ of the synchronization accuracy (variation in the synchronization accuracy) at the i-th point is represented by the following Equation 2. In the following Equation 2, the average value $\mu_i$ of the Y coordinates represented by the above Equation 1 is set to be the reference position, and it is indicated how much the Y coordinate of the point to be evaluated deviates from the reference position.

$$\sigma_i^2 = \frac{1}{n-1} \sum_{j=i-(n-1)}^{i} (\delta y_{j+n-1} - \mu_j)^2 \tag{2}$$

Note that when the number of measurement points in the chip region is N, i=1, 2, . . . , N. FIG. 9A illustrates the result of evaluating the variation in the synchronization accuracy. In FIG. 9A, the result of extrapolating the variation in the synchronization accuracy at each point is illustrated by the dotted line. A maximum value (that is, worst value) MSD1 of the values of the variation in the synchronization accuracy illustrated by the dotted line is defined as the variation in the synchronization accuracy for the chip region CH-1 in the shot region.

Figure 10A:
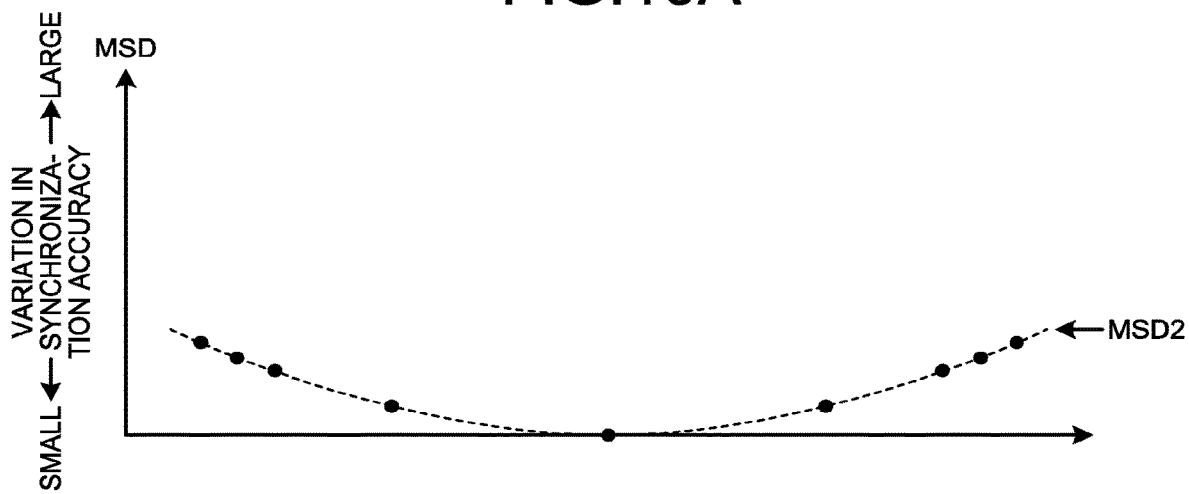
FIGS. 10A to 10C are diagrams illustrating the evaluation results of variations in the synchronization accuracy of the exposure device according to the embodiment.
Figure 10B:
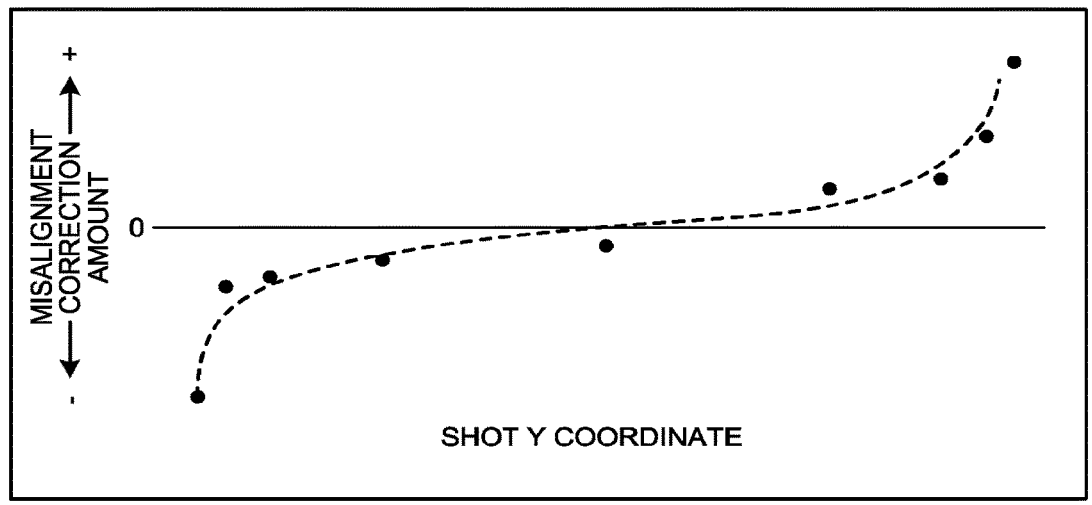
Figure 10C:
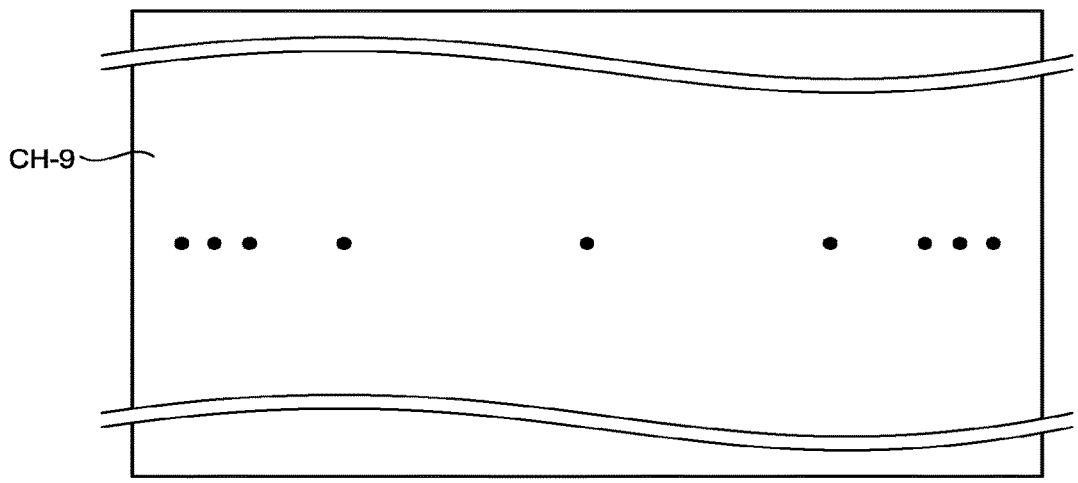

Similarly, for the chip region CH-9 in the shot region, when the original plate stage 2 and the substrate stage 60 are synchronously scanned according to the misalignment correction amount illustrated in FIG. 10B, the result of evaluating the variation in the synchronization accuracy at each point illustrated in FIG. 10C is illustrated as in FIG. 10A. In FIG. 10A, the result of extrapolating the variation in the synchronization accuracy at each point is illustrated by a dotted line. A maximum value MSD2 of the values of the variation in the synchronization accuracy illustrated by the dotted line is defined as the variation in the synchronization accuracy for the chip region CH-9 in the shot region.

Figure 11:
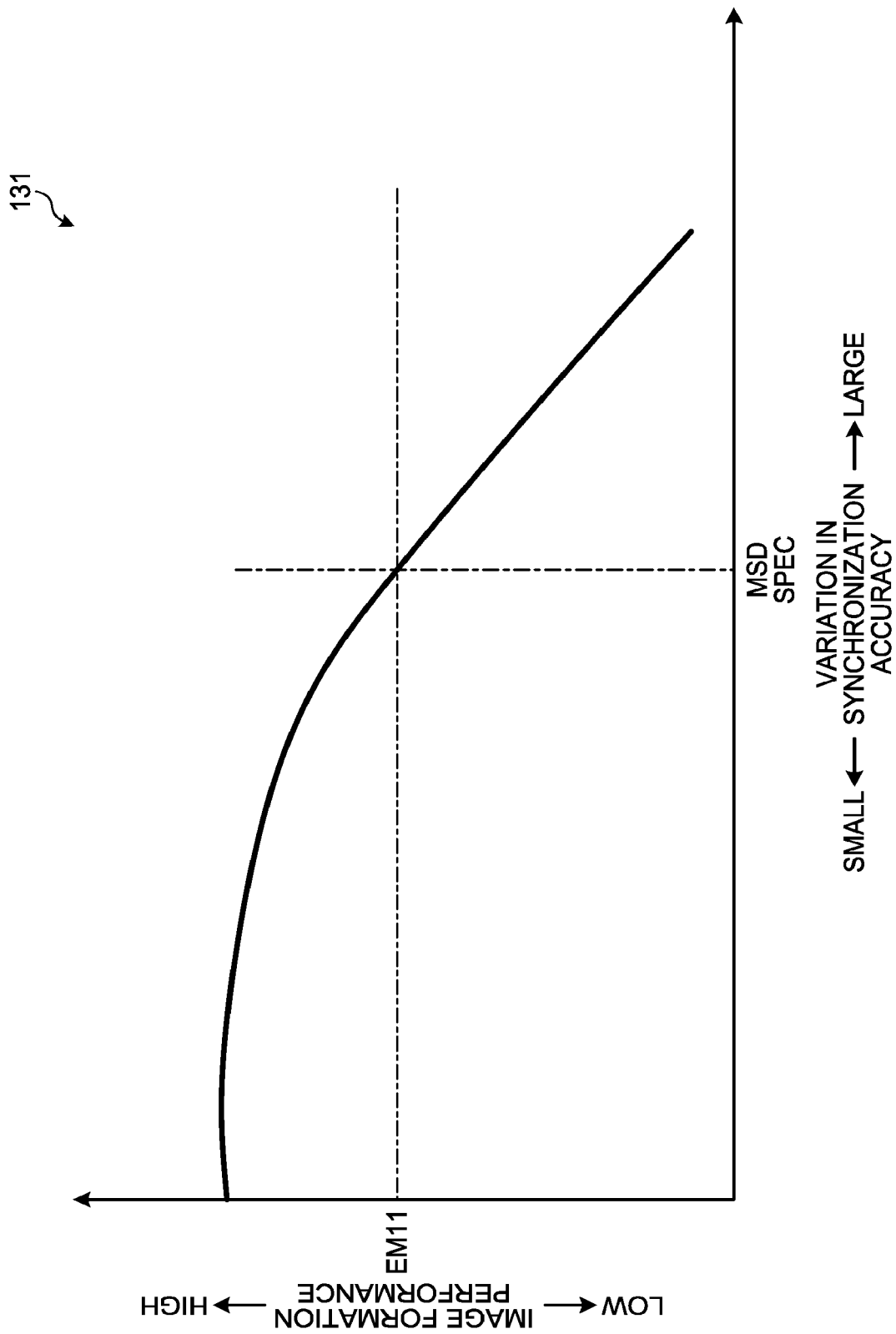
FIG. 11 is a diagram illustrating a configuration of device information according to the embodiment.

The semiconductor device manufacturing system 100 creates the device information 131 using the image formation performance evaluated in S13 and the synchronization accuracy (variation in synchronization accuracy) evaluated in S14 (S15). The semiconductor device manufacturing system 100 plots the image formation performance and the operation accuracy for each chip region in the shot region on a coordinate plane by setting the image formation performance of the exposure device 103 on the vertical axis and the variation in the synchronization accuracy on the horizontal axis, and creates the device information 131 illustrated in FIG. 11. FIG. 11 is a diagram illustrating the configuration of the device information 131.

For example, for the chip region CH-1 in the shot region, the image formation performance EM1 and the variation MSD1 in the synchronization accuracy are plotted on the coordinate plane illustrated in FIG. 11.

For the chip region CH-9 in the shot region, the image formation performance EM2 and the variation MSD2 in the synchronization accuracy are plotted on the coordinate plane illustrated in FIG. 11.

On the coordinate plane illustrated in FIG. 11, a plurality of plots are extrapolated, and the relationship between the image formation performance of the exposure device 103 and the variation in the synchronization accuracy is obtained as the device information 131. In FIG. 11, the result of extrapolating the plurality of plots is illustrated by a solid line.

The semiconductor device manufacturing system 100 stores the created device information 131 in the database 130.

The semiconductor device manufacturing system 100 specifies the required image formation performance (S16). The semiconductor device manufacturing system 100 refers to the database 130 and acquires the exposure condition information 133 corresponding to the type to be processed. The specifying unit 1092 specifies the image formation performance (for example, image formation performance EM11) required for the type to be processed based on the exposure condition information 133.

The semiconductor device manufacturing system 100 specifies the constraints of the mechanical operation accuracy (S17). When the required image formation performance is specified, the semiconductor device manufacturing system 100 refers to the database 130 and acquires the device information 131 corresponding to the type to be processed. The semiconductor device manufacturing system 100 specifies the constraints of the mechanical operation accuracy according to the acquired device information 131 and the required image formation performance. For example, the semiconductor device manufacturing system 100 specifies the synchronization accuracy corresponding to the required image formation performance in the device information 131 as the upper limit (MSD SPEC) of the variation in the synchronization accuracy.

For example, when the image formation performance specified in S16 is EM11, as illustrated in FIG. 11, in the device information 131, the value of the synchronization accuracy corresponding to the image formation performance EM11 is specified as the upper limit (MSD SPEC) of the variation in the synchronization accuracy. As illustrated in FIG. 11, the semiconductor device manufacturing system 100 can secure the image formation performance EM11 required for the exposure device 103 by operating the exposure device 103 so as not to exceed the upper limit (MSD SPEC) of the variation in the synchronization accuracy.

Figure 12:
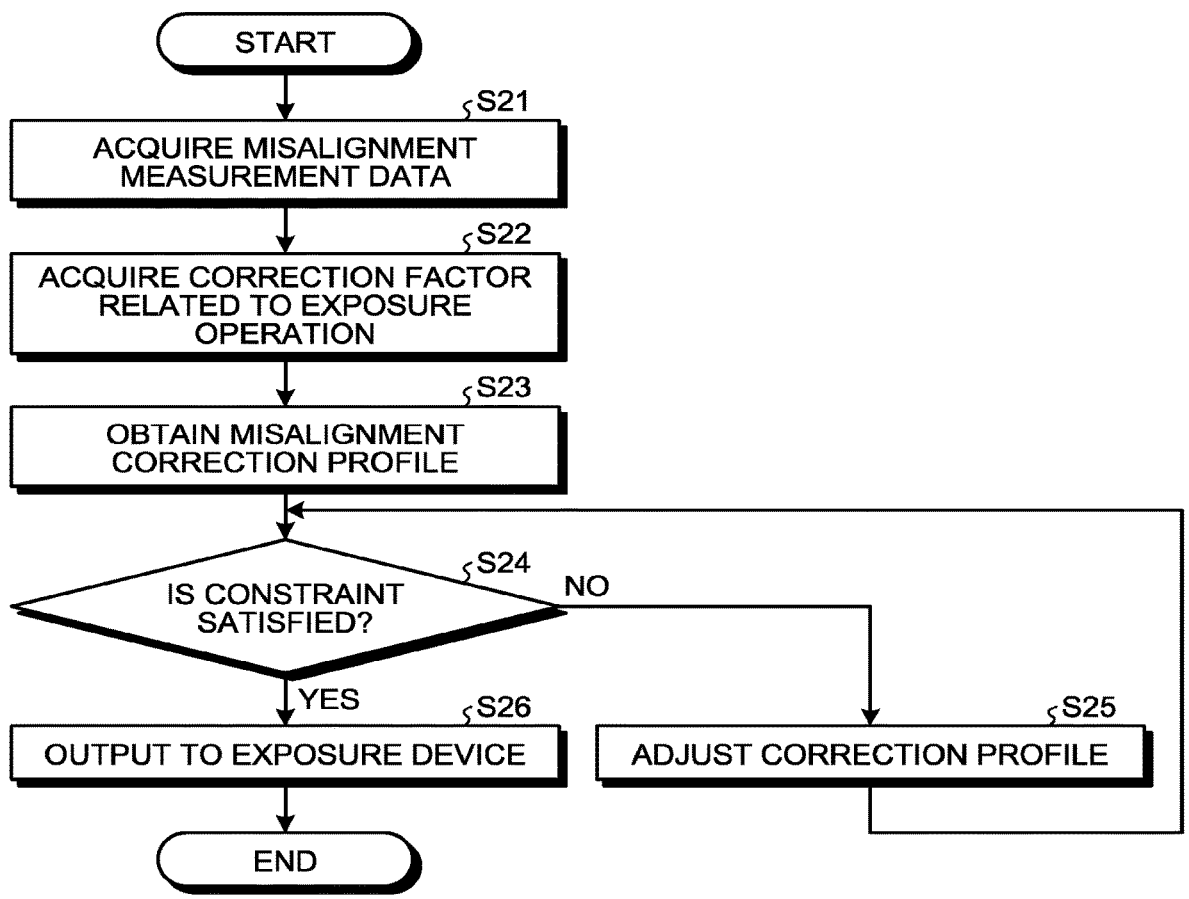
FIG. 12 is a flowchart illustrating a correction parameter adjustment process in the embodiment.

Next, details of the correction parameter adjustment process (S3) will be described with reference to FIG. 12. FIG. 12 is a flowchart illustrating the correction parameter adjustment process (S3).

The semiconductor device manufacturing system 100 acquires the misalignment measurement data of the same process (S21). The semiconductor device manufacturing system 100 may perform the exposure process of the same process for each shot region with respect to the substrate having the plurality of shot regions. Alternatively, a plurality of substrates processed as the same lot may be subjected to the exposure process in the same process. At this time, it is possible to obtain the misalignment measurement data in the same process for the shot region that is exposed.

For example, the measurement device 103a uses a predetermined mark or a predetermined pattern of the lower layer on the substrate to perform the measurement for determining the pattern transfer position to the upper layer before the pattern formation. The measurement device 103a measures a predetermined mark or a predetermined pattern in a state where a layer L1 including a predetermined mark and a predetermined pattern is formed on the substrate W and a layer L2 is formed on the layer L1 before the pattern formation. That is, the measurement device 103a measures the reference position for the pattern transfer to the upper layer.

Note that the semiconductor device manufacturing system 100 may further acquire strain measurement data regarding the strain of the substrate measured by the strain measurement device 107. Thereby, the misalignment measurement data can be further corrected in consideration of the strain of the substrate.

The semiconductor device manufacturing system 100 extracts the misalignment component of the chip region to be processed from the misalignment measurement data of the alignment target in the chip region CH. That is, the semiconductor device manufacturing system 100 refers to the database 130 and acquires the exposure condition information 133. The semiconductor device manufacturing system 100 acquires the exposure condition information 133 as information for extracting the misalignment component of the chip region to be processed from the misalignment measurement data. The exposure condition information 133 can include, for example, information on an operation log of the exposure device 103 in the same process, layout data in the shot region, OPC data for mask alignment, and the like. The semiconductor device manufacturing system 100 extracts the misalignment component of the chip region to be processed according to the exposure condition information 133.

The semiconductor device manufacturing system 100 calculates the misalignment measurement data of each chip region to be processed in the shot region according to a predetermined function for each measurement data, and obtains the misalignment amount of the chip region to be processed in the shot region.

The semiconductor device manufacturing system 100 acquires a correction factor related to the exposure operation (S22). The semiconductor device manufacturing system 100 refers to the database 130 and acquires the correction parameter information 132 corresponding to the type to be processed. The semiconductor device manufacturing system 100 obtains the correction profile for the misalignment measurement of each chip region to be processed in the shot region according to the acquired correction parameter information 132 (S23).

Figure 14A:
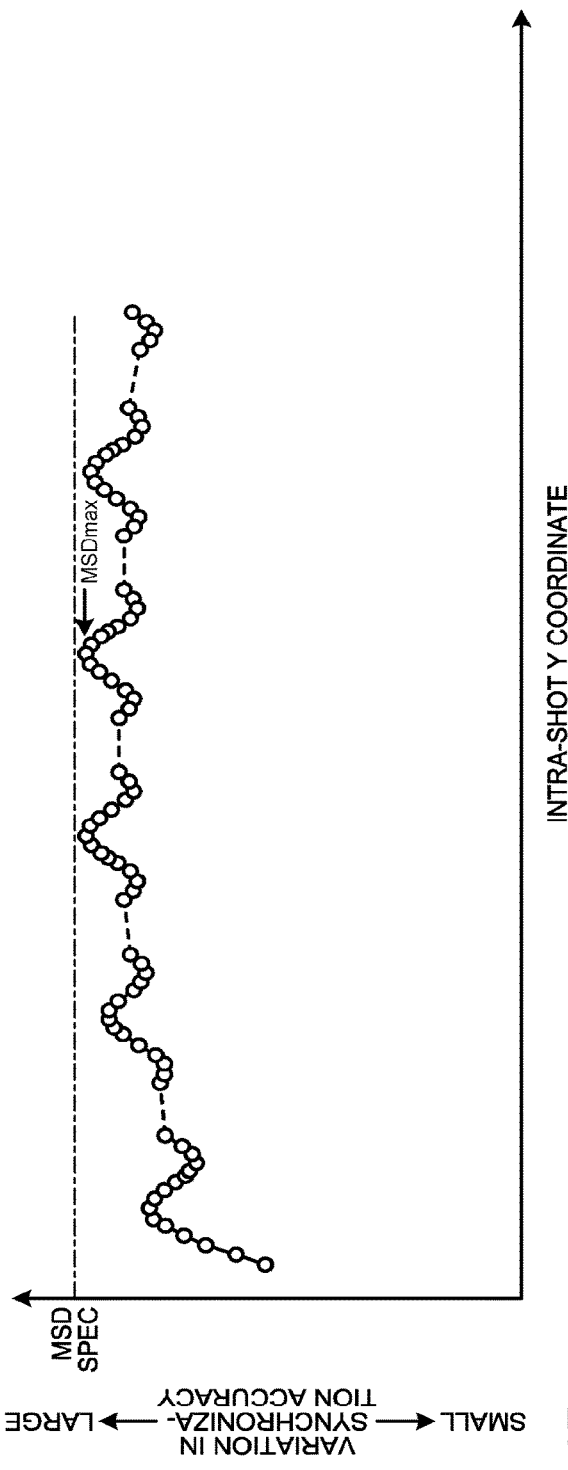
FIGS. 14A and 14B are diagrams illustrating the correction parameter adjustment process according to the embodiment.
Figure 14B:
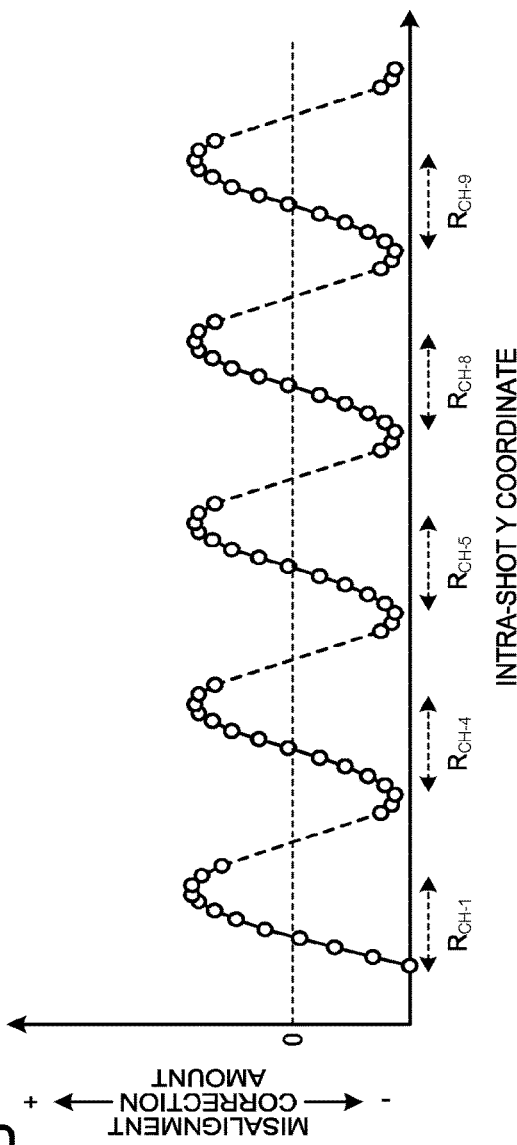

For example, for the chip regions CH-1, CH-4, CH-5, CH-8, and CH-9 of each measurement target in the shot region (see FIG. 6A), the correction profile of the misalignment correction as illustrated in FIG. 14B is calculated from the predetermined function. The semiconductor device manufacturing system 100 calculates the correction profile so that a residual difference 3o is minimized above the image formation performance capability required by the exposure scan operation of the exposure device 103. FIGS. 14A and 14B are diagrams illustrating the correction parameter adjustment process, and FIG. 14B illustrates that the vertical axis represents the magnitude of the misalignment correction amount and the horizontal axis represents the intra-shot Y coordinate. On the horizontal axis, the Y-coordinate ranges corresponding to the chip regions CH-1, CH-4, CH-5, CH-8, and CH-9 are indicated as $R_{CH\text{-}1}$, $R_{CH\text{-}4}$, $R_{CH\text{-}5}$, $R_{CH\text{-}8}$, and $R_{CH\text{-}9}$, respectively. In FIG. 14B, the solid line corresponds to the range in which the exposure device 103 performs the scanning operation for the chip region to be processed, and the dotted line corresponds to the range in which the exposure device 103 returns to an initial position for the next chip region.

Further, the semiconductor device manufacturing system 100 applies the misalignment correction amount to the value of the Y coordinate measured by the measurement device 103a, and applies the applied result to Equations 1 and 2. As a result, the semiconductor device manufacturing system 100 obtains the variation in the synchronization accuracy as illustrated in FIG. 14A for the chip regions CH-1, CH-4, CH-5, CH-8, and CH-9 of each measurement target in the shot region. In FIG. 14A, the vertical axis represents the magnitude of the variation in the synchronization accuracy, and the horizontal axis represents the intra-shot Y coordinate. In FIG. 14A, the solid line corresponds to the range (scanning region) in which the exposure device 103 performs the scanning operation for the chip region to be processed, and the dotted line corresponds to the range in which the exposure device 103 returns to the initial position for the next chip region.

The semiconductor device manufacturing system 100 acquires the constraint (MSD SPEC) specified in S17 (see FIG. 5) and determines whether the variation in the synchronization accuracy according to the correction profile obtained in S23 satisfies the constraint (MSD SPEC) (S24).

For example, as illustrated in FIG. 14A, the semiconductor device manufacturing system 100 obtains the worst value, that is, the maximum value $MSD_{MAX}$ among the variations in the synchronization accuracy for each chip region of the measurement target in the shot region. The semiconductor device manufacturing system 100 determines that the variation in the synchronization accuracy does not satisfy the constraint if the maximum value $MSD_{MAX}$ of the variation in the synchronization accuracy is equal to or more than the MSD SPEC.

When the variation in the synchronization accuracy according to the correction profile obtained in S23 does not satisfy the constraints (No in S24), the semiconductor device manufacturing system 100 adjusts the correction profile so that the constraints are satisfied (S25). That is, the semiconductor device manufacturing system 100 adjusts the correction profile so that the variation in synchronization accuracy is reduced. The semiconductor device manufacturing system 100 adjusts the correction profile so that the absolute value of the misalignment correction amount becomes smaller when it is known that the variation in the synchronization accuracy becomes smaller by reducing the absolute value of the misalignment correction amount.

The semiconductor device manufacturing system 100 determines again whether or not the variation in the synchronization accuracy according to the correction profile adjusted in S25 satisfies the constraints (MSD SPEC) (S24).

The semiconductor device manufacturing system 100 obtains the worst value, that is, the maximum value $MSD_{MAX}$ again among the variations in the synchronization accuracy for the chip region of the measurement target in the shot region. The semiconductor device manufacturing system 100 determines that the variation in the synchronization accuracy does not satisfy the constraint if the maximum value $MSD_{MAX}$ of the variation in the synchronization accuracy is equal to or more than the MSD SPEC.

A loop of S24 to S25 is repeated until it is determined that the variation in the synchronization accuracy satisfies the constraints. As illustrated in FIG. 14A, the semiconductor device manufacturing system 100 determines that the variation in the synchronization accuracy satisfies the constraints if the maximum value $MSD_{MAX}$ of the variation in the synchronization accuracy is less than the MSD SPEC.

The semiconductor device manufacturing system 100 outputs, to the exposure device 103, the correction profile created or adjusted in S23 to S25 when the variation in the synchronization accuracy according to the correction profile obtained in S23 or the correction profile adjusted in S25 satisfies the constraints (Yes in S24). At this time, the semiconductor device manufacturing system 100 converts a data format of the correction profile and outputs the converted data format to the exposure device 103.

As described above, in the present embodiment, in the semiconductor device manufacturing system 100, the relationship between the image formation performance and the mechanical operation accuracy is created in advance as the device information 131, the constraints (MSD SPEC) of the operation accuracy are specified according to the device information 131 and the required image formation performance, and the correction parameters are adjusted according to the constraints. As a result, it is possible to promptly optimize the correction parameter while maintaining the image formation performance, and appropriately and promptly perform the exposure process and the process related thereto.

Figure 13A:
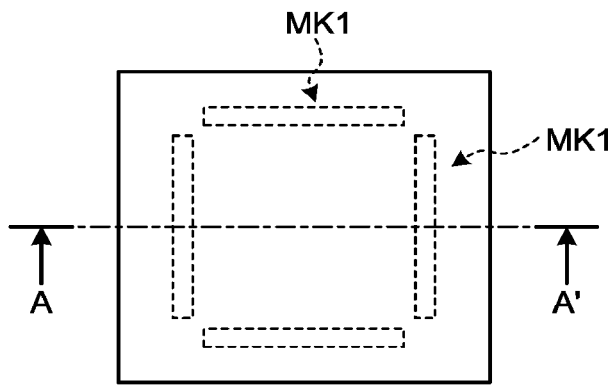
FIGS. 13A to 13D are diagrams illustrating a measurement target of a measurement device according to the embodiment.
Figure 13B:
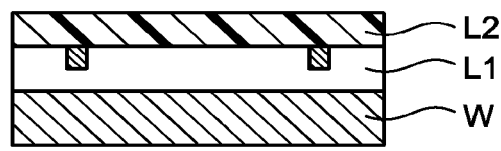

Note that the misalignment measurement data acquired in S21 of FIG. 12 can use the measurement data of various misalignment measurement methods. For example, the misalignment measurement data may be the measurement data of the small measurement mark arranged in the device region DR within the chip region CH of the measurement target, the measurement data of the main body pattern arranged in the device region DR within the chip region CH of the measurement target, or the overlay mark MK1 arranged in the kerf region KR within the chip region CH of the measurement target. For example, as illustrated in FIGS. 13A and 13B, the measurement device 103a may measure the overlay mark MK1 in the state in which the layer L1 including the overlay mark MK1 is formed on the substrate W and the layer L2 is formed on the layer L1 before the pattern formation. FIGS. 13A and 13B are diagrams illustrating the measurement target of the measurement device 103a. FIG. 13B illustrates a cross section cut along the A-A' line of FIG. 13A.

Figure 13C:
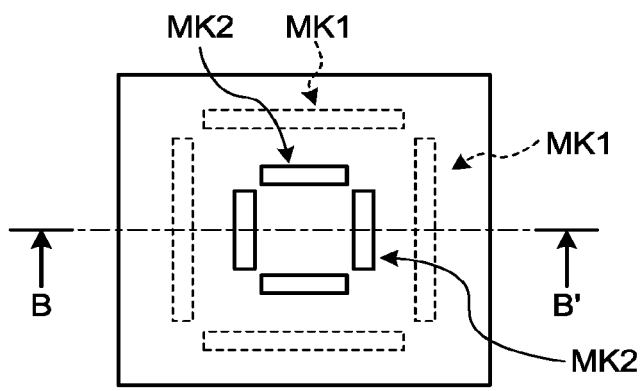
Figure 13D:
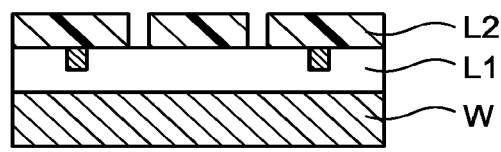

In addition, the idea of the present embodiment can be applied to the misalignment measurement device 106. The misalignment measurement device 106 has a measurement device 106a. The measurement device 106a measures the misalignment amount between the upper and lower layers by using the overlay marks of the upper and lower layers on the substrate. For example, as illustrated in FIGS. 13C and 13D, the measurement device 106a measures the overlay marks MK1 and MK2 in the state in which the layer L1 including the overlay mark MK1 (or the first small measurement mark in the device region DR, or the like) of the kerf region KR within the chip region CH is formed on the substrate W and the layer L2 including the overlay mark MK2 (or the second small measurement mark, or the like) is formed on the layer L1. FIGS. 13C and 13D are diagrams illustrating the measurement target of the measurement device 106a. FIG. 13D is a diagram illustrating a cross section cut along the line B-B' of FIG. 13C.

At this time, the semiconductor device manufacturing system 100 creates the relationship between the image formation performance of the misalignment measurement device 106 and the mechanical operation accuracy as the device information in advance, specifies the constraints of the operation accuracy according to the device information and the required image formation performance, and adjusts the correction parameters according to the constraints. The misalignment measurement device 106 may perform the measurement while performing the correction with the adjusted correction parameters. As a result, the misalignment between the upper and lower layers can be accurately measured, and the accuracy of the inspection as to whether or not the exposure has been appropriately performed can be improved.

Figure 15:
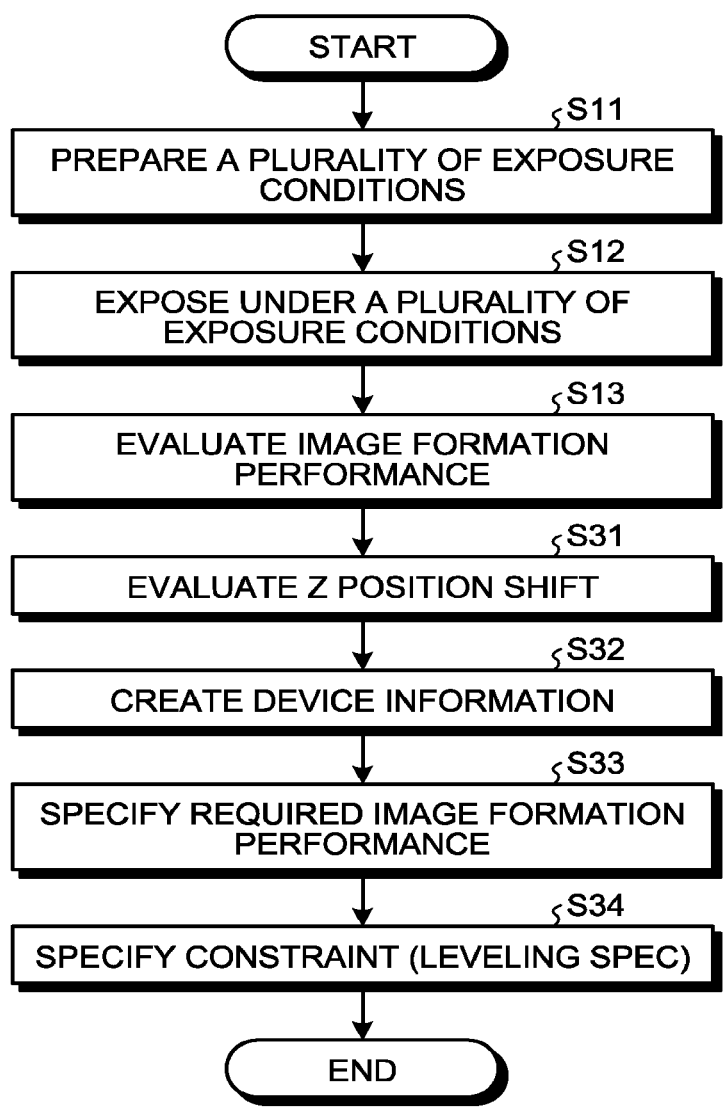
FIG. 15 is a flowchart illustrating a device information creation process according to a modified example of the embodiment.

Further, the idea of the present embodiment can be applied to height adjustment (leveling) of the substrate, instead of the scanning operation of the exposure device 103. For example, in the device information creation process (S1), as illustrated in FIG. 15, the processes different from that of the embodiment are performed in the following points. FIG. 15 is a flowchart illustrating a device information creation process according to a modified example of the embodiment.

After performing S11 to S13 as in the embodiment, the semiconductor device manufacturing system 100 performs the focus measurement and the like on the FEM substrate by the focus detection system 21, and evaluates the Z position shift from the best focus plane with respect to the plane position of the substrate (S31). The Z position shift from the best focus plane is also called the focus shift.

Figure 16:
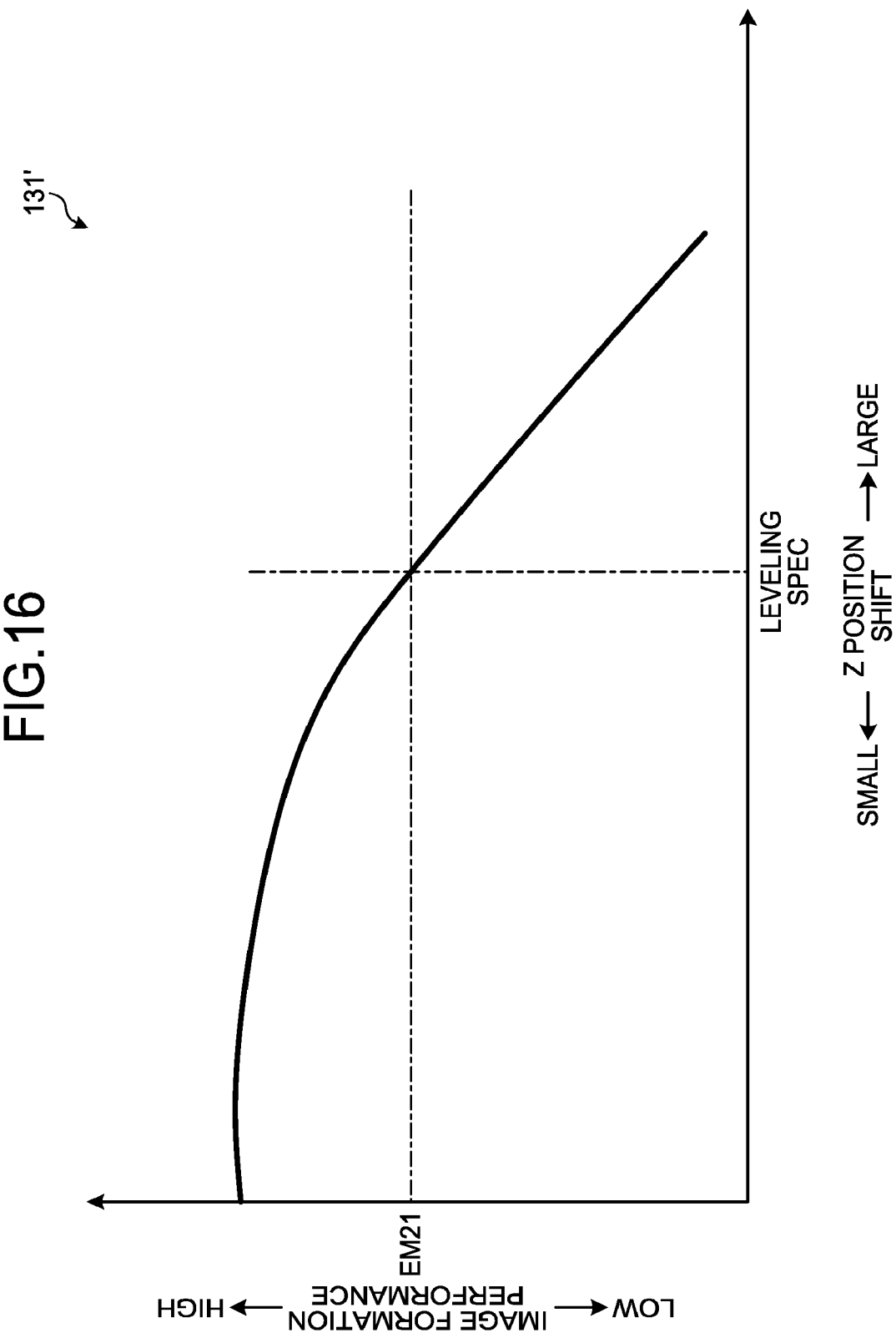
FIG. 16 is a diagram illustrating a configuration of device information according to a modified example of the embodiment.

The semiconductor device manufacturing system 100 uses the image formation performance evaluated in S13 and the Z position shift evaluated in S31 to create the device information 131' (S32). The semiconductor device manufacturing system 100 plots the image formation performance and the Z position shift for each chip region in the shot region on the coordinate plane by setting the image formation performance of the exposure device 103 on the vertical axis and the Z position shift on the horizontal axis, and creates the device information 131' illustrated in FIG. 16, for example. FIG. 16 is a diagram illustrating the configuration of the device information 131' according to a modification of the embodiment.

The semiconductor device manufacturing system 100 specifies the required image formation performance (S33). The semiconductor device manufacturing system 100 refers to the database 130 and acquires the exposure condition information 133 corresponding to the type to be processed.

The specifying unit 1092 specifies the image formation performance (for example, image formation performance EM21) required for the type to be processed based on the exposure condition information 133.

The semiconductor device manufacturing system 100 specifies the constraints of the mechanical operation accuracy (S34). When the required image formation performance is specified, the semiconductor device manufacturing system 100 refers to the database 130 and acquires the device information 131' corresponding to the type to be processed. The semiconductor device manufacturing system 100 specifies the constraints of the mechanical operation accuracy according to the acquired device information 131' and the required image formation performance. For example, the semiconductor device manufacturing system 100 specifies the Z position shift corresponding to the required image formation performance in the device information 131 as the upper limit (leveling SPEC) of the Z position shift.

For example, when the image formation performance specified in S33 is EM21, as illustrated in FIG. 16, in the device information 131', the value of the Z position shift corresponding to the image formation performance EM21 is specified as the upper limit (leveling SPEC) of the Z position shift. As illustrated in FIG. 16, the semiconductor device manufacturing system 100 can secure the image formation performance EM21 required for the exposure device 103 by operating the exposure device 103 so as not to exceed the upper limit (leveling SPEC) of the Z position shift.

Figure 17:
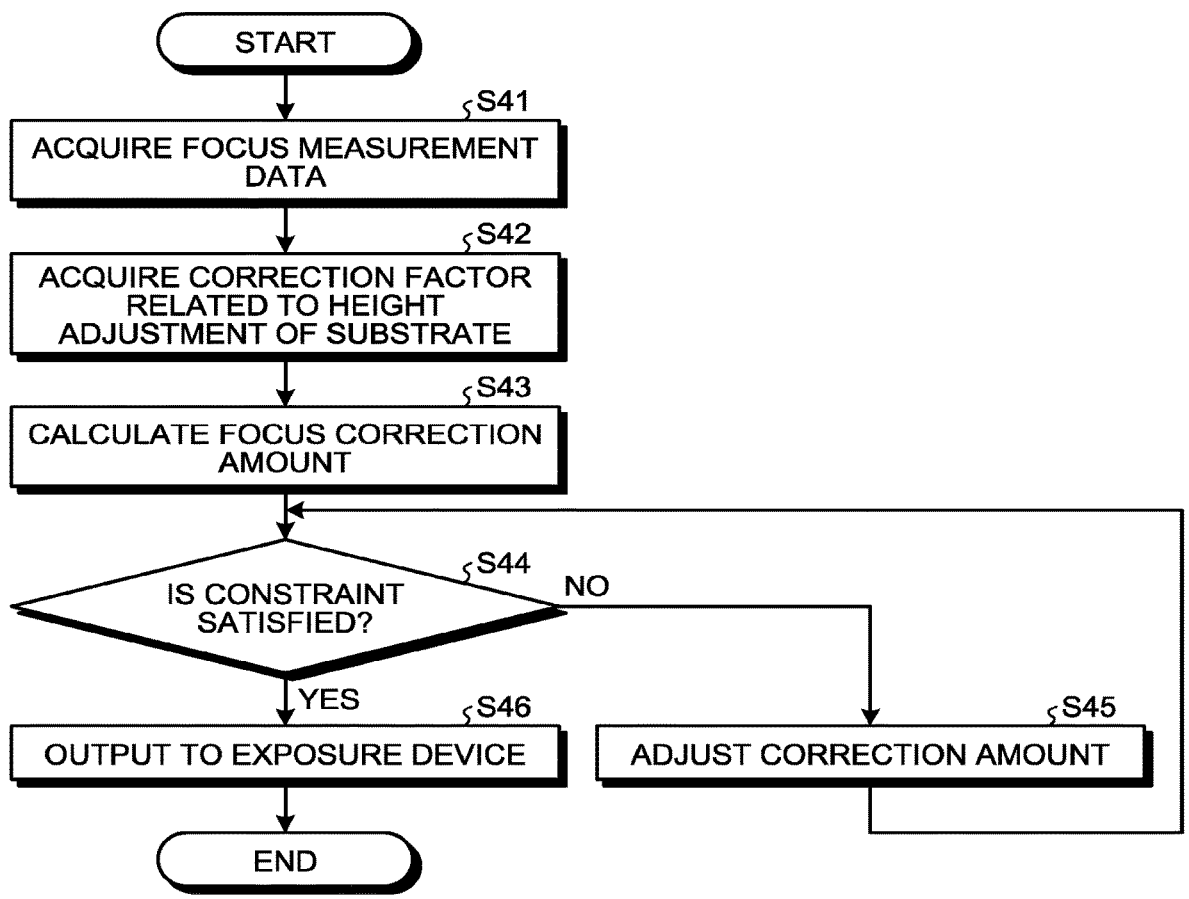
FIG. 17 is a flowchart illustrating a correction parameter adjustment process according to a modified example of the embodiment.

Further, details of the correction parameter adjustment process (S3) are different from those of the embodiment, as illustrated in FIG. 17. FIG. 17 is a flowchart illustrating the correction parameter adjustment process (S3).

The semiconductor device manufacturing system 100 acquires the focus measurement data of the same process (S41). The semiconductor device manufacturing system 100 acquires the focus measurement data from the exposure device 103. Further, the semiconductor device manufacturing system 100 acquires dimension measurement data from the dimension measurement device 108. The focus measurement data is data indicating the focus value. The dimension measurement data is data indicating a CD measurement value. The semiconductor device manufacturing system 100 may finely adjust the focus value indicated by the focus measurement data according to the dimension measurement data.

Note that the semiconductor device manufacturing system 100 may further acquire strain measurement data regarding the strain of the substrate measured by the strain measurement device 107. Thereby, the focus measurement data can be further corrected in consideration of the strain of the substrate.

The semiconductor device manufacturing system 100 acquires a correction factor related to the height adjustment (leveling) of the substrate (S42). The semiconductor device manufacturing system 100 refers to the database 130 and acquires the correction parameter information 132' corresponding to the type to be processed. The semiconductor device manufacturing system 100 obtains the focus correction amount of each chip region to be processed in the shot region according to the acquired correction parameter information 132' (S43).

Figure 18:
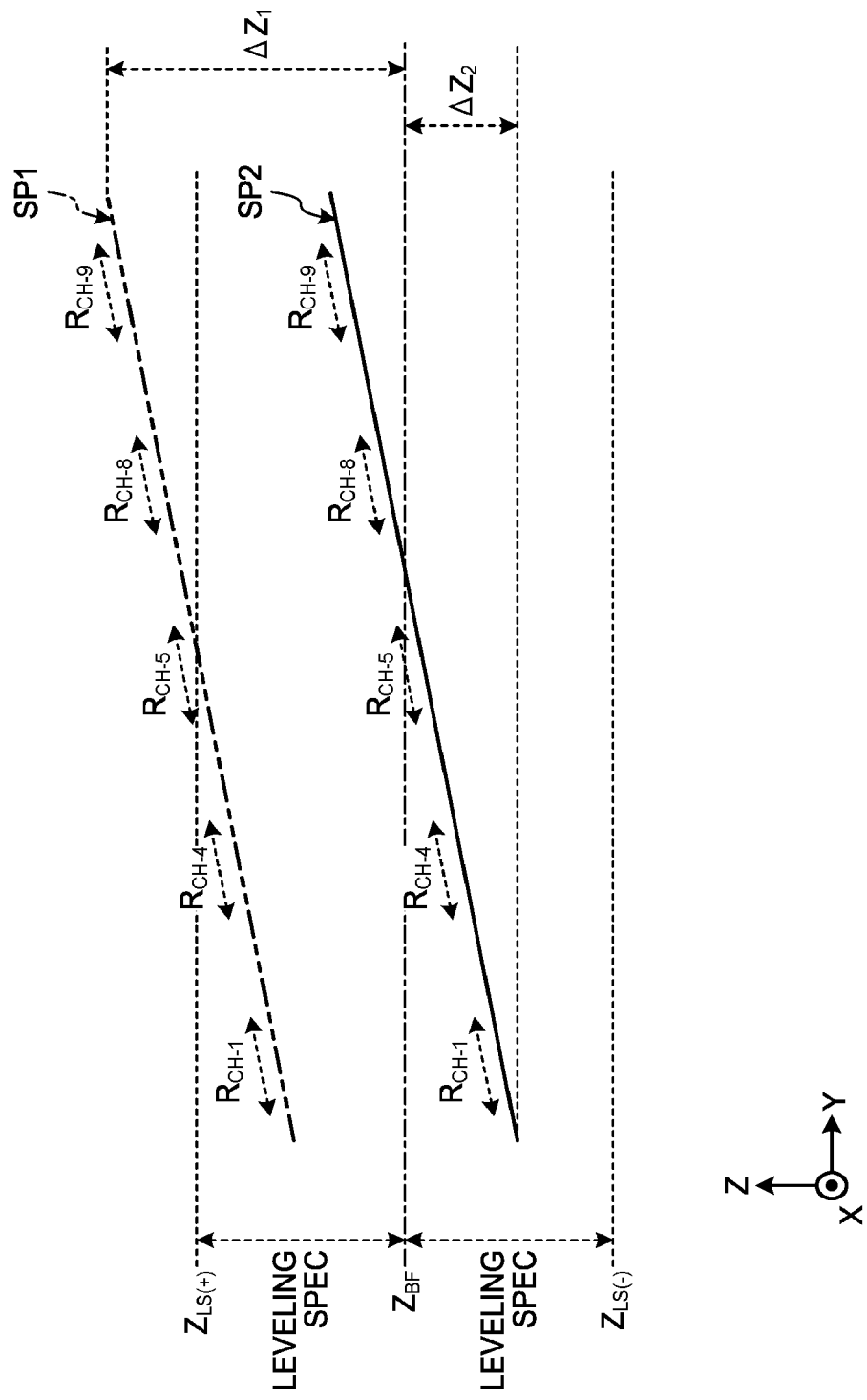
FIG. 18 is a diagram illustrating a correction parameter adjustment process according to a modified example of the embodiment.

For example, for the chip region CH-1, CH-4, CH-5, CH-8, and CH-9 of each measurement target in the shot region (see FIG. 6A), focus measurement profiles SP1 and SP2 as illustrated by a two-dot chain line and a solid line in FIG. 18 are calculated from the predetermined function. The semiconductor device manufacturing system 100 calculates the focus correction amount so that the Z position of the substrate is located within the focus depth of the best focus plane. FIG. 18 is a diagram illustrating the correction parameter adjustment process, and FIG. 18 illustrates that the vertical axis represents the Z position and the horizontal axis represents the intra-shot Y coordinate. On the horizontal axis, the Y-coordinate ranges corresponding to the chip regions CH-1, CH-4, CH-5, CH-8, and CH-9 are indicated as $R_{CH-1}$, $R_{CH-4}$, $R_{CH-5}$, $R_{CH-8}$, and $R_{CH-9}$, respectively.

The semiconductor device manufacturing system 100 acquires the constraint (leveling SPEC) specified in S34 (see FIGS. 15 and 16) and determines whether the variation in the synchronization accuracy according to the correction profile obtained in S23 satisfies the constraint (MSD SPEC) (S44).

For example, as illustrated in FIG. 18, the semiconductor device manufacturing system 100 obtains a maximum value $\Delta Z$ of the Z position shift from the Z position $Z_{BF}$ of the best focus plane among the Z positions of the chip region of each measurement target in the shot region. The semiconductor device manufacturing system 100 determines that the Z position shift does not satisfy the constraint if the maximum value $\Delta Z$ of the Z position shift is equal to or more than the leveling SPEC. For example, in the focus measurement profile SP1 indicated by the chain double-dashed line in FIG. 18, the maximum value $\Delta Z_1$ of the Z position shift is equal to or more than the leveling SPEC, and it is determined that the Z position shift does not satisfy the constraints. In FIG. 18, a Z position $Z_{LS(+)}$ is a Z position on a +Z side where the Z direction distance from the best focus surface is the leveling SPEC, and a Z position $Z_{LS(-)}$ is a Z position on a −Z position where the Z direction distance from the best focus surface is the leveling SPEC.

If the Z position shift corresponding to the profile obtained in S43 does not satisfy the constraints (No in S44), the semiconductor device manufacturing system 100 adjusts the correction amount so that the constraints are satisfied (S45). That is, the semiconductor device manufacturing system 100 adjusts the correction amount so that the Z position shift is reduced.

The semiconductor device manufacturing system 100 again determines whether or not the Z position shift according to the correction amount adjusted in S45 satisfies the constraints (leveling SPEC) (S44).

The semiconductor device manufacturing system 100 again obtains the worst value, that is, the maximum value $\Delta Z$ again among the Z position shift for each chip region of the measurement target in the shot region. The semiconductor device manufacturing system 100 determines that the Z position shift does not satisfy the constraint if the maximum value $\Delta Z$ of the Z position shift is equal to or more than the leveling SPEC.

The loop of S44 to S45 is repeated until it is determined that the Z position shift satisfies the constraints. The semiconductor device manufacturing system 100 determines that the variation in the synchronization accuracy does not satisfy the constraints if the maximum value $\Delta Z$ of the Z position shift is less than the leveling SPEC. For example, in the focus measurement profile SP2 indicated by the solid line in FIG. 18, the maximum value $\Delta Z_2$ of the Z position shift is less than the leveling SPEC, and it is determined that the Z position shift does not satisfy the constraints.

If the Z position shift corresponding to the correction amount obtained in S43 or the correction amount adjusted in S45 satisfies the constraints (Yes in S44), the semiconductor device manufacturing system 100 outputs the correction amount created or adjusted in S43 to S45 to the exposure device 103. At this time, the semiconductor device manufacturing system 100 converts the data format of the correction amount and outputs the converted data format to the exposure device 103.

As described above, for the adjustment of the height position of the substrate, in the semiconductor device manufacturing system 100, the relationship between the image formation performance and the mechanical operation accuracy is created in advance as the device information 131', the constraints (leveling SPEC) of the operation accuracy are specified according to the device information 131' and the required image formation performance, and the focus correction amount is adjusted according to the constraints. Thereby, it is possible to promptly optimize the focus correction amount while maintaining the image formation performance, and it is possible to appropriately and promptly perform the height adjustment of the substrate.

Figure 19:
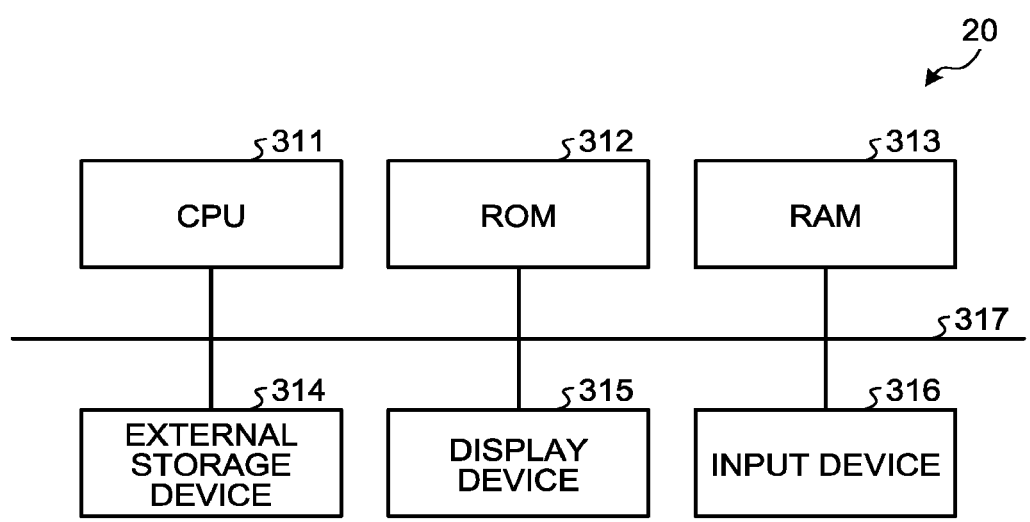
FIG. 19 is a diagram illustrating a hardware configuration of a host controller according to the embodiment and the modified example thereof.

FIG. 19 is a diagram illustrating an example of a hardware configuration of the host controller 109. The host controller 109 includes a central processing unit (CPU) 311, a read only memory (ROM) 312, a random access memory (RAM) 313 that is a main storage device, external storage devices 314 such as a hard disk drive (HDD), a solid state drive (SSD), or a compact disc (CD) drive device, a display device 315 such as a liquid crystal display device, and input devices 316 such as a keyboard and a mouse, and these components are connected to each other via a bus line 317 and have a hardware configuration using a normal computer.

The program executed by the host controller 109 according to the present embodiment executes the method illustrated in FIGS. 4, 5, 12, 15, and 17, and is provided by being recorded on a computer-readable recording medium such as a CD-ROM, a flexible disk (FD), a CD-R, a digital versatile disk (DVD) as a file in an installable format or an executable format.

Further, the program executed by the host controller 109 according to the present embodiment may be configured to be stored in a computer connected to a network such as the Internet and provided by being downloaded via the network. Further, the program executed by the host controller 109 according to the present embodiment may be provided or distributed via a network such as the Internet.

Further, the program according to the present embodiment may be configured to be provided by being incorporated in a ROM or the like in advance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device manufacturing system, comprising:
   a storage unit that stores device information indicating a relationship between image formation performance of an exposure device used for manufacturing a semiconductor device and mechanical operation accuracy, the image formation performance relating to a range of exposure amounts for allowable critical dimensions of a pattern to be formed and to a range of focus values for the allowable critical dimensions of the pattern to be formed;
   a specifying unit that specifies a constraint of the mechanical operation accuracy according to the device information and the required image formation performance;
   a determination unit that determines whether or not a correction parameter of an exposure condition satisfies the constraint, the correction parameter including a correction amount profile of overlay error correction between an upper layer and a lower layer in each shot region in a substrate including a plurality of shot regions; and
   an adjustment unit that adjusts the correction parameter according to a determination result of the determination unit including changing the correction amount profile when the correction amount profile does not satisfy the constraint.

2. The semiconductor device manufacturing system according to claim 1, wherein
   the exposure device is a scanning exposure device,
   the operation accuracy includes synchronization accuracy between scanning of an original plate stage and scanning of a substrate stage, and
   the constraint includes an upper limit of synchronization accuracy corresponding to the required image formation performance in the device information.

3. The semiconductor device manufacturing system according to claim 1, wherein the correction parameter includes a correction amount profile for performing the overlay error correction between an upper layer and a lower layer for each chip region in each shot region in the substrate including the plurality of shot regions each having a plurality of chip regions.

4. The semiconductor device manufacturing system according to claim 1, wherein the semiconductor device manufacturing system supplies the adjusted correction parameter to the exposure device when the adjusted correction parameter satisfies the constraint of the operation accuracy.

5. The semiconductor device manufacturing system according to claim 2, wherein the semiconductor device manufacturing system supplies the adjusted correction parameter to the exposure device when the synchronization accuracy corresponding to the adjusted correction parameter is equal to or less than the upper limit of the synchronization accuracy.

6. A semiconductor device manufacturing system, comprising:
   a storage unit that stores device information indicating a relationship between image formation performance of an exposure device used for manufacturing a semiconductor device and a height position error from a best focus height position of a substrate, the image formation performance relating to a range of exposure amounts for allowable critical dimensions of a pattern to be formed and to a range of focus values for the allowable critical dimensions of the pattern to be formed;
   a specifying unit that specifies a constraint of the height position error of the substrate according to the stored device information and required image formation performance;
   a determination unit that determines whether or not a correction parameter of an exposure condition satisfies the constraint, the correction parameter including a correction amount of a focus correction to correct the height position error from the best focus height position in each shot region in a substrate including a plurality of shot region; and an adjustment unit that adjusts the correction parameter according to a determination result of the determination unit including changing the correction amount when the correction amount does not satisfy the constraint.

7. The semiconductor device manufacturing system according to claim 6, wherein the constraint includes an upper limit of the height position error corresponding to the required image formation performance in the device information.

8. The semiconductor device manufacturing system according to claim 6, wherein the correction parameter includes a correction amount for performing a focus correction for each chip region in each shot region in a substrate including a plurality of shot regions each having a plurality of chip regions.

9. The semiconductor device manufacturing system according to claim 6, wherein the semiconductor device manufacturing system supplies the adjusted correction parameter to the exposure device in a case where the adjusted correction parameter satisfies the constraint of the operation accuracy.

10. The semiconductor device manufacturing system according to claim 7, wherein the semiconductor device manufacturing system supplies the adjusted correction parameter to the exposure device when a height position error corresponding to the adjusted correction parameter is equal to or less than an upper limit of the height position error.

11. A semiconductor device manufacturing method, comprising:

storing device information indicating a relationship between image formation performance of an exposure device used for manufacturing a semiconductor device and mechanical operation accuracy, the image formation performance relating to a range of exposure amounts for allowable critical dimensions of a pattern to be formed and to a range of focus values for the allowable critical dimensions of the pattern to be formed;

specifying a constraint of the mechanical operation accuracy according to the stored device information and required image formation performance;

determining whether a correction parameter of an exposure condition satisfies the constraint, the correction parameter including a correction amount profile of overlay error correction between an upper layer and a lower layer in each shot region in a substrate including a plurality of shot regions; and adjusting the correction parameter according to the determination result including changing the correction amount profile when the correction amount profile does not satisfy the constraint.

12. The semiconductor device manufacturing method according to claim 11, wherein the exposure device is a scanning exposure device, the operation accuracy includes synchronization accuracy between scanning of an original plate stage and scanning of a substrate stage, and the constraint includes an upper limit of synchronization accuracy corresponding to the required image formation performance in the device information.

13. The semiconductor device manufacturing method according to claim 11, wherein the correction parameter includes a correction amount profile for performing the overlay error correction for each chip region in each shot region in the substrate including the plurality of shot regions each having a plurality of chip regions.

14. The semiconductor device manufacturing method according to claim 11, further comprising:

supplying the adjusted correction parameter to the exposure device when the adjusted correction parameter satisfies a constraint of the operation accuracy.

* * * * *